(12) United States Patent
Yao et al.

(10) Patent No.: US 8,124,251 B2
(45) Date of Patent: Feb. 28, 2012

(54) THIN FILMS OF FERROELECTRIC MATERIALS AND A METHOD FOR PREPARING SAME

(75) Inventors: Kui Yao, Singapore (SG); Shuhui Yu, Singapore (SG); Francis Eng Hock Tay, Singapore (SG)

(73) Assignee: Agency for Science, Technology and Research, Centros (SG)

( * ) Notice: Subject to any disclaimer, the term of this patent is extended or adjusted under 35 U.S.C. 154(b) by 679 days.

(21) Appl. No.: 11/333,774

(22) Filed: Jan. 17, 2006

(65) Prior Publication Data

US 2006/0183249 A1     Aug. 17, 2006

(30) Foreign Application Priority Data

Jan. 18, 2005   (SG) ................. 200500286-0

(51) Int. Cl.
*B32B 9/00*   (2006.01)
(52) U.S. Cl. .................. 428/701; 428/702
(58) Field of Classification Search .............. 347/72; 428/701
See application file for complete search history.

(56) References Cited

U.S. PATENT DOCUMENTS 5,998,910 A * 12/1999 Park et al. ............ 310/358
6,337,032 B1    1/2002 Chivukula
6,723,186 B2 *  4/2004 Lee et al. ............. 148/537

FOREIGN PATENT DOCUMENTS

EP    1493840 A2    1/2001
GB    2349272 A    10/2000
WO    WO 2004-068605   *  8/2004

OTHER PUBLICATIONS

Liao Proposal(http://www.ensc.sfu.ca/~msjoerds/Schedule.htm).*
Detavernier et al. ("Letters to Nature", Nature 426, 641-645).*
Jang et al. ("Stabilization of perovskite phase . . . ", J/ Mater. Res, vol. 9, No. 10, Oct. 1994).*
Dictionary.com (http://dictionary.reference.com/browse/film).*
Shuhui Yu, et al., "Structure and Properties of (1-x)PZN-xPT Thin Films with Perovskite Phase Promoted by Polyethylene Glycol", Chem. Mater., published online on Oct. 3, 2006, vol. 18., pp. 5343-5350, Singapore.

* cited by examiner

*Primary Examiner* — Timothy Speer
(74) *Attorney, Agent, or Firm* — Jack D. Stone, Jr.; Scheef & Stone, L.L.P.

(57) ABSTRACT

Thin films of ferroelectric material with a high mole fraction of $Pb(A^{2+}_{1/3}B^{5+}_{2/3})O_3$ substantially in a perovskite phase, wherein A is zinc or a combination of zinc and magnesium, and B is a valence 5 element such as niobium or tantalum, have been prepared. Typically, the mole fraction of $Pb(A^{2+}_{1/3}B^{5+}_{2/3})O_3$ in the ferroelectric material is >0.7. The method for preparing the thin films of ferroelectric material comprises providing a precursor solution containing lead, $A^{2+}$, and $B^{5+}$; modifying the precursor solution by addition of a polymer species thereto; applying the modified precursor solution to a surface of a substrate and forming a coating thereon; and (d) subjecting the coating to a heat treatment and forming the film in the perovskite phase. Optimal results have been obtained with PEG200 as the polymer species.

23 Claims, 11 Drawing Sheets

THIN FILMS OF FERROELECTRIC MATERIALS AND A METHOD FOR PREPARING SAME

CLAIM OF PRIORITY

This application claims priority, under 35 U.S.C. §119, to Singapore Application No. 200500286-0, filed Jan. 18, 2005, the contents of which are incorporated herein by reference in their entirety.

FIELD OF THE INVENTION

The present invention relates to thin films of a ferroelectric material and a method of preparation therefor. In particular the present invention relates to thin films of ferroelectric material with a high mole fraction of $Pb(Zn_{1/3}Nb_{2/3})O_3$ in a perovskite phase.

BACKGROUND OF THE INVENTION

In recent years, perovskite oxide solid-solution systems based on ferroelectric $Pb(Zn_{1/3}Nb_{2/3})O_3$ (PZN), such as $(1-x)Pb(Zn_{1/3}Nb_{2/3})O_3$-$xPbTiO_3$ (PZN-PT); have attracted great attention due to their extremely large electromechanical strain and high dielectric constant. A PZN-PT single crystal exhibits high electromechanical coupling coefficients ($k_{33}$>90%), and high piezoelectric coefficients ($d_{33}$>2200 pC/N), properties which are significantly superior to those of the most widely used piezoelectric $Pb(Zr,Ti)O_3$ (PZT) materials. Therefore, the success in developing perovskite PZN-PT bulk single crystal is thought as the most significant breakthrough in piezoelectric materials for the last few decades. In addition, as relaxor ferroelectrics, PZN-PT-based materials also exhibit a high dielectric constant and may have great potential for capacitor application.

Thin films of perovskite PZN-based materials, particularly having a tailored crystallographic orientation to obtain optimal performance properties, are in demand for application in microelectronics and micro electromechanical systems (MEMS). However, the preparation of useful perovskite PZN-based thin films is extremely challenging because of the poor stability of the perovskite phase relative to the pyrochlore phase for the PZN composition.

Previously, the perovskite phase has only been obtained and stabilized in PZN-based thin films by resorting to preparing a PZN-PT thin film composition with a high molar proportion of $PbTiO_3$ (PT) (>50% in mole) and increasing the thickness of the thin film to above several micrometers. Furthermore, the perovskite crystallographic structure in the prepared films was not in a preferred orientation.

A randomly orientated PZN-PT film with a very low PZN composition does not demonstrate optimal characteristics for commercial applications for several reasons. Firstly, the best electromechanical property in bulk PZN-PT single crystal is exhibited with the composition around the so-called morphotropic phase boundary (MPB) between rhombohedral and tetragonal phases, i.e. 0.9PZN-0.1PT. If the PT component of the composition is more than 50% (mole) the composition significantly shifts from the MPB, with observed degradation in the electrical and electromechanical properties.

Further, although superior electromechanical performance properties are observed along certain crystallographic directions in bulk PZN-PT single crystals, PZN-PT bulk ceramic materials with random crystallographic orientation do not exhibit the same excellent performance properties. Accordingly, a randomly orientated PZN-PT film may not be better than a PZT film in terms of its electromechanical properties.

Finally, while the perovskite phase may be stabilized in films having thicknesses beyond several micrometers, such films are too thick for many commercial applications.

The present invention seeks to overcome at least some of the aforementioned disadvantages.

It is to be understood that, although use and publications are referred to herein, such reference does not constitute an admission that any of these form a part of the common general knowledge in the art.

SUMMARY OF THE INVENTION

The present invention is based on the discovery that it is possible to effectively stabilize a perovskite phase relative to a pyrochlore phase in a thin film of ferroelectric PZN-based materials when the precursor solutions used to prepare the thin films are modified by addition of a polymer species.

According to a first aspect of the invention there is provided a method of preparing a thin film of ferroelectric material with a high mole fraction of $Pb(A^{2+}_{1/3}B^{5+}_{2/3})O_3$ substantially in a perovskite phase, wherein A is zinc or a combination of zinc and magnesium, and B is a valence 5 element, which method comprises providing a precursor solution containing lead, $A^{2+}$, and $B^{5+}$; modifying the precursor solution by addition of a polymer species thereto; applying the modified precursor solution to a surface of a substrate and forming a coating thereon; and subjecting the coating to a heat treatment and forming the film in the perovskite phase.

In one embodiment, B is niobium. In another embodiment, B is tantalum.

The inventors have also demonstrated that elimination or minimization of the pyrochlore phase in the thin films of ferroelectric material prepared in accordance with the above method is significantly affected by the type of polymer species employed, its molecular weight, and the concentration of the polymer species in the modified precursor solutions.

Preferably, the molecular weight of the polymer species is less than 400.

Preferably, the polymer species is polyethylene glycol. More preferably, the polymer species is polyethylene glycol with a molecular weight of 200 (PEG200).

Preferably, the PEG200 is present in the precursor solution in up to 60 wt % based on a metal oxide content in the precursor solution, and more preferably PEG200 is present in the precursor solution at 60 wt % based on a metal oxide content in the precursor solution.

Once a target composition for the desired ferroelectric material is selected, the precursor solutions are prepared by mixing a first solution containing substantially stoichiometric molar ratios of lead, $A^{2+}$, and $B^{5+}$ to form $Pb(A^{2+}_{1/3}B^{5+}_{2/3})O_3$ and a second solution containing substantially stoichiometric molar ratios of lead and titanium to form $PbTiO_3$.

Preferably, the precursor solution has an excess of 15 molar % lead with respect to target composition stoichiometry to compensate for volatilization of lead during heat treatment of the film.

In accordance with a second aspect of the present invention there is provided a modified precursor solution for preparing a thin film of ferroelectric material with a high mole fraction of $Pb(A^{2+}_{1/3}B^{5+}_{2/3})O_3$ substantially in a perovskite phase, wherein A is zinc or a combination of zinc and magnesium, and B is a valence 5 element, the modified precursor solution containing lead, $A^{2+}$, $B^{5+}$, and a polymer.

In one embodiment, B is niobium. In another embodiment, B is tantalum.

Preferably, the precursor solution for a specific target composition is prepared by mixing a first solution containing substantially stoichiometric molar ratios of lead, $A^{2+}$, and $B^{5+}$ to form $Pb(A^{2+}_{1/3}B^{5+}_{2/3})O_3$ and a second solution containing substantially stoichiometric molar ratios of lead and titanium to form $PbTiO_3$.

Even more preferably, the modified precursor solution has an excess of 15 molar % lead with respect to target composition stoichiometry to compensate for volatilization of lead during heat treatment of the film.

Preferably, the polymer species has a molecular weight less than 400.

Typically, the polymer species is polyethylene glycol, preferably with a molecular weight of 200 (PEG200).

Although PEG200 may be present in the modified precursor solution in an amount up to 60 wt % based on a metal oxide content in the precursor solution, in the preferred embodiment PEG200 is present in the modified precursor solution in an amount of 60 wt % based on a metal oxide content in the precursor solution.

In contrast to previous unsuccessful attempts by others, the inventors have employed the method of the present invention to obtain thin films of ferroelectric material in the perovskite phase with a specific crystallographic orientation with high piezoelectric coefficients.

Thus according to a third aspect of the invention there is provided a thin film of ferroelectric material with a high mole fraction of $Pb(A^{2+}_{1/3}B^{5+}_{2/3})O_3$ substantially in a perovskite phase deposited on a surface of a substrate, wherein A is zinc or a combination of zinc and magnesium, and B is a valence 5 element.

In one embodiment, B is niobium. In another embodiment, B is tantalum.

The inventors have found that the method of the present invention allows preparation of thin films of ferroelectric material with mole fraction $Pb(A^{2+}_{1/3}B^{5+}_{2/3})O_3 > 0.7$, wherein the content of the ferroelectric $Pb(A^{2+}_{1/3}B^{5+}_{2/3})O_3$ material is substantially in the perovskite phase. Thin films of both $(1-x)Pb(Zn_{1/3}Nb_{2/3})O_3 - xPbTiO_3$ (PZN-PT) and $(1-x)Pb((Zn_{(1-y)}Mg_y)_{1/3}Nb_{2/3})O_3 - xPbTiO_3$ (PZN-PMN-PT) based ferroelectric materials have been prepared wherein the mole fraction of $Pb(Zn_{1/3}Nb_{2/3})O_3$ is $>0.45$, wherein the ferroelectric materials are in the perovskite phase. The composition of the PZN-PT ferroelectric materials is preferably $(1-x)Pb(Zn_{1/3}Nb_{2/3})O_3 - xPbTiO_3$ ($0.05 \leq x < 0.3$), whilst the composition of the PZN-PMN-PT ferroelectric materials is preferably $(1-x)Pb((Zn_{(1-y)}Mg_y)_{1/3}Nb_{2/3})O_3 - xPbTiO_3$ ($x < 0.3$ and $0 < y < 0.7$). The inventors have demonstrated that the perovskite phase is the dominant phase for the thin films of ferroelectric materials of the above described compositions and that a pyrochlore phase is substantially absent.

Advantageously, employment of the present invention affords thin films of ferroelectric material wherein the composition thereof approaches the morphotropic phase boundary, preferably $0.9Pb(Zn_{1/3}Nb_{2/3})O_3 - 0.1PbTiO_3$ or $0.462Pb(Zn_{1/3}Nb_{2/3})O_3 - 0.308Pb(Mg_{1/3}Nb_{2/3})O_3 - 0.23PbTiO_3$.

Furthermore, the thickness of the films of the present invention could be much thinner than films obtained by any known methods. In the present invention, a small thickness is not a constraint for the formation of the perovskite phase. Typically, the thickness of the thin film of ferroelectric material of the present invention is at least 0.20 µm. Preferably, the thin film of ferroelectric material is (001)-oriented.

The perovskite phase of the thin film of ferroelectric material is stabilized relative to the pyrochlore phase when the surface on which it is deposited is provided with a perovskite structure such that the thin film of ferroelectric material is epitaxially formed on the perovskite structure of the surface of the substrate.

Preferably, the substrate is a single crystal with a perovskite structure, such as $LaAlO_3$ (LAO) and the thin film of ferroelectric material is epitaxially formed on the perovskite structure of the surface of the single crystal.

Alternatively, the surface of the substrate preferably has a textured perovskite structure, and the thin film of ferroelectric material is epitaxially formed on the textured perovskite structure of the surface of the substrate.

In another embodiment, the substrate is a conductive metal oxide layer with perovskite structure epitaxially deposited on a single crystal material with perovskite structure, and the thin film of ferroelectric material is epitaxially formed on the conductive layer.

Alternatively, the substrate is an epitaxial metal oxide conductive layer with perovskite structure epitaxially deposited on at least one buffer layer which is deposited on a single non-perovskite crystal material, such as silicon, and the thin film of ferroelectric material is deposited on the metal oxide conductive layer.

Preferably, the conductive metal oxide layer is selected from a group including, but not limited to, $La_xSr_{1-x}MnO_3$, $La_xCa_{1-x}FeO_3$, $LaNiO_3$, $SrRuO_3$, $La_xSr_{1-x}CoO_3$, $La_xSr_{1-x}FeO_3$.

Typically, a thickness of the conductive metal oxide layer is between 200-350 nm.

In a preferred embodiment of the present invention the buffer layer is selected from a group comprising yttria-stabilized zirconia (YSZ), $YBa_2Cu_3O_{7-\delta}$(YBCO), $La_{0.7}Sr_{0.3}MnO_3$ (LSMO). Typically, the buffer layer comprises successively grown epitaxial layers of zirconia (YSZ), $YBa_2Cu_3O_{7-\delta}$(YBCO), and $La_{0.7}Sr_{0.3}MnO_3$ (LSMO).

A thickness of the YSZ layer is 20-150 nm, a thickness of the YBCO layer is 100-250 nm, and a thickness of the LSMO layer is 200-350 nm.

In accordance with a fourth aspect of the invention there is provided a microelectronic device provided with a thin film of ferroelectric material comprising a high mole fraction of $Pb(A^{2+}_{1/3}B^{5+}_{2/3})O_3$ substantially in a perovskite phase, wherein A is zinc or a combination of zinc and magnesium, and B is a valence 5 element.

In one embodiment, B is niobium. In another embodiment, B is tantalum.

In accordance with a fifth aspect of the invention there is provided a micro electromechanical systems device provided with a thin film of ferroelectric material comprising a high mole fraction of $Pb(A^{2+}_{1/3}B^{5+}_{2/3})O_3$ substantially in a perovskite phase, wherein A is zinc or a combination of zinc and magnesium, and B is a valence 5 element.

In one embodiment, B is niobium. In another embodiment, B is tantalum.

In the claims of this application and in the description of the invention, except where the context requires otherwise due to express language or necessary implication, the words "comprise" or variations such as "comprises" or "comprising" are used in an inclusive sense, i.e. to specify the presence of the stated features, but not to preclude the presence or addition of further features in various embodiments of the invention.

In the claims of this application and in the description of the invention, "polymer" generally refers to organic chemicals or materials comprising multiple "monomer" unit structure, including an oligomer.

Further, it will be understood that a reference to the terms "ferroelectric perovskite material" or "perovskite ferroelectric material" throughout the present specification refers to a ferroelectric material of any of the aforementioned compositions provided with a perovskite structure (or a perovskite phase).

BRIEF DESCRIPTION OF THE DRAWINGS

Preferred embodiments, incorporating all aspects of the invention, will now be described by way of example only with reference to the accompanying drawings, in which.

DETAILED DESCRIPTION OF THE PREFERRED EMBODIMENTS OF THE INVENTION

Figure 1:
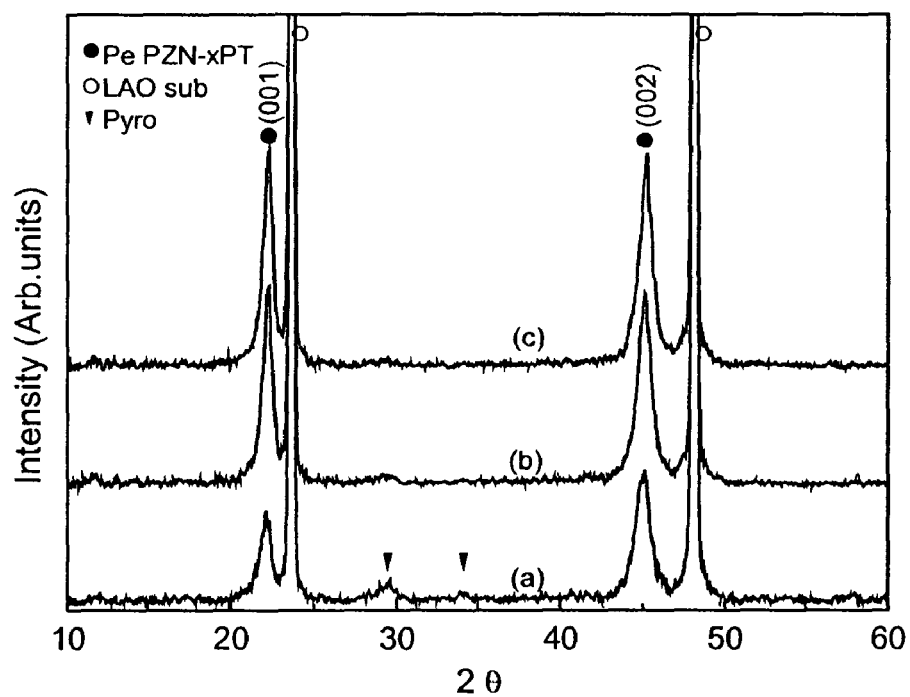
FIG. 1 shows x-ray diffraction (XRD) patterns of (1-x)Pb($Zn_{1/3}Nb_{2/3}$)$O_3$-xPbTiO$_3$ (PZN-xPT) thin films on LaAlO$_3$ (LAO) substrate prepared from the precursor solutions modified with 60 wt % of PEG200: (a) PZN-0.1PT, (b) PZN-0.2PT, and (c) PZN-0.3PT according to Example 1, and annealed at 580° C. for 10 minutes.

The invention primarily relates to thin films of ferroelectric materials with a high mole fraction of Pb($A^{2+}_{1/3}B^{5+}_{2/3}$)$O_3$ substantially in a perovskite phase, wherein A is zinc or a combination of zinc and magnesium, and B is a valence 5 element, such as niobium or tantalum. The invention also relates to the use of a chemical solution deposition process, in which a precursor solution is modified by addition of a polymer species thereto, to effectively stabilize the perovskite phase in the thin films of the ferroelectric material relative to a pyrochlore phase on various substrates.

The inventors have found that it is possible to prepare thin films of ferroelectric materials of general formula (1-x)Pb($Zn_{1/3}Nb_{2/3}$)$O_3$-xPbTiO$_3$ (PZN-xPT) or (1-x)Pb((Zn,Mg)$_{1/3}$Nb$_{2/3}$)$O_3$-xPbTiO$_3$ (PZMN-xPT) with a mole fraction of Pb($A^{2+}_{1/3}B^{5+}_{2/3}$)$O_3$>0.7, and to stabilize the films substantially in the perovskite phase relative to the pyrochlore phase. Typically, the mole fraction of Pb($Zn_{1/3}Nb_{2/3}$)$O_3$ in the ferroelectic material is greater than 0.45. This is in marked contrast to previous workers in the field who have only achieved perovskite ferroelectric materials of general formula PZN-xPT with xPT at least 55 mole %.

Preferably, the ferroelectric material is $(1-x)Pb(Zn_{1/3}Nb_{2/3})O_3$-$xPbTiO_3$ $(0.05 \leq x \leq 0.3)$ or $(1-x)Pb((Zn_{(1-y)}Mg_y)_{1/3}Nb_{2/3})O_3$-$xPbTiO_3$ $(x \leq 0.3$ and $0 \leq y \leq 0.7)$.

The best electromechanical properties in bulk PZN-PT and PZN-PMN-PT single crystals are exhibited with the composition around the morphotropic phase boundary (MPB) between rhombohedral and tetragonal phases. Advantageously, the thin films of ferroelectric material of the present invention can be prepared with the composition around the MPB. The composition of the thin film of PZN-PT-based ferroelectric material around the MPB is $0.9Pb(Zn_{1/3}Nb_{2/3})O_3$-$0.1PbTiO_3$. The composition of the thin film of PZN-PMN-PT-based ferroelectric material around the MPB is $0.462Pb(Zn_{1/3}Nb_{2/3})O_3$-$0.308Pb(Mg_{1/3}Nb_{2/3})O_3$-$0.23PbTiO_3$.

The perovskite phase of the thin film of ferroelectric material is stabilized relative to an undesirable pyrochlore phase when a surface of a substrate on which the thin film is directly deposited also has a perovskite structure. Accordingly, the thin film of ferroelectric material may be deposited directly on a perovskite single crystal substrate or on a conductive layer with a single crystal or epitaxial perovskite phase. The conductive layer can be epitaxially grown on a perovskite single crystal substrate, or a non-perovskite single crystal substrate, such as silicon, through introducing appropriate oxide buffer layers.

For example, in one embodiment of the invention, the substrate is a single crystal, such as $LaAlO_3$ (LAO), with a perovskite structure, and the thin film of ferroelectric material is epitaxially formed on the perovskite structure of the surface of the single crystal.

In an alternative embodiment, the surface of the substrate has a textured perovskite structure, and the thin film of ferroelectric material is epitaxially formed on the textured perovskite structure of the surface of the substrate.

In a further embodiment, the substrate is a conductive metal oxide layer with perovskite structure epitaxially deposited on a single crystal material with perovskite structure, and the thin film of ferroelectric material is epitaxially formed on the conductive layer. Preferably, the conductive metal oxide layer is selected from a group comprising $La_xSr_{1-x}MnO_3$, $La_xCa_{1-x}FeO_3$, $LaNiO_3$, $SrRuO_3$, $La_xSr_{1-x}CoO_3$, $La_xSr_{1-x}FeO_3$.

In a yet further embodiment, the substrate is an epitaxial metal oxide conductive layer with perovskite structure epitaxially deposited on at least one buffer layer on a single non-perovskite crystal material, and the thin film of ferroelectric material is deposited on the metal oxide conductive layer. Preferably, the conductive metal oxide layer is selected from a group comprising $La_xSr_{1-x}MnO_3$, $La_xCa_{1-x}FeO_3$, $LaNiO_3$, $SrRuO_3$, $La_xSr_{1-x}CoO_3$, $La_xSr_{1-x}FeO_3$. Typically, the conductive metal oxide layer is between 200-350 nm thick.

The buffer layer and the conductive layer are generally selected from a group comprising yttria-stabilized zirconia (YSZ), $YBa_2Cu_3O_{7-67}$ (YBCO), $La_{0.7}Sr_{0.3}MnO_3$ (LSMO), and comprises successively grown epitaxial layers of zirconia (YSZ), $YBa_2Cu_3O_{7-67}$ (YBCO), $La_{0.7}Sr_{0.3}MnO_3$ (LSMO). Typically, the YSZ layer is 20-150 nm thick, the YBCO layer is 100-250 nm thick, and the LSMO layer is 200-350 nm thick.

In this particular embodiment, the single crystal material is silicon, preferably (100)-oriented silicon.

The conductive oxide layer described above functions as both a seeding layer for the crystallization of the perovskite phase of the thin film of ferroelectric material and the electrode layer for the ferroelectric material. The above discussion also demonstrates that it is possible to form a thin film of ferroelectric material on a non-perovskite single crystal substrate, such as silicon, by introducing appropriate intermediate buffer layers between the non-perovskite substrate and the epitaxial perovskite metal oxide layers.

A further advantage of the present invention over the present technology is that the thickness of thin films of ferroelectric material could extend across the range from micrometers to nanometer, rather than being constrained to beyond several micrometers.

The thin films of ferroelectric materials of the present invention exhibit a high dielectric constant and excellent piezoelectric properties. For example, the thin film of 0.77 (0.6PZN-0.4PMN)-0.23PT discussed in Example 5 exhibits strong ferroelectric characteristics. The dielectric constant and loss are 3497 ad 0.06 at 1 kHz, respectively, and the dilatation of the thin film is about 325 pm in thickness direction at 5V.

Accordingly, it is envisaged that the thin films of ferroelectric materials of the present invention will be employed in microelectronic devices and microelectromechanical systems (MEMS) devices, such as: (1) integrated piezoelectric micro-actuators for many diverse applications, including microfluidic, ink-jet printing, nano-positioning (for example for hard disk drive, nano-scale manipulation, and such like), micro ultrasonic devices, optical switchers and modulators, switchers for RF MEMS, actuators for bioMEMS; (2) high frequency ultrasonic transducers for medical imaging; (3) micro resonators for many device applications; (4) integrated piezoelectric sensors; and, (5) integrated thin film capacitors.

A thin film of ferroelectric material with a high mole fraction of $Pb(A^{2+}_{1/3}B^{5+}_{2/3})O_3$ substantially in the perovskite phase, wherein A is zinc or a combination of zinc and magnesium, and B is a valence 5 element, such as niobium or tantalum, is prepared according to the following method, which method comprises providing a precursor solution containing lead, A, and B; modifying the precursor solution by addition of a polymer species thereto; applying the modified precursor solution to a surface of a substrate and forming a coating thereon; and subjecting the coating to a heat treatment and forming the film in the perovskite phase.

A target composition for the desired ferroelectric material is selected. The target compositions for PZN-PT-based ferroelectric materials are typically $(1-x)Pb(Zn_{1/3}Nb_{2/3})O_3$-$xPbTiO_3$ $(0.05 \leq x \leq 0.3)$ and the target compositions for PZN-PMN-PT-based ferroelectric materials are typically $(1-x)Pb((Zn_{(1-y)}Mg_y)_{1/3}Nb_{2/3})O_3$-$xPbTiO_3$ $(x \leq 0.3$ and $0 \leq y \leq 0.7)$.

The precursor solution for the target composition for the ferroelectric material is prepared by mixing a first solution containing substantially stoichiometric molar ratios of lead, A, and B to form $Pb(A^{2+}_{1/3}B^{5+}_{2/3})O_3$ and a second solution containing substantially stoichiometric molar ratios of lead and titanium to form $PbTiO_3$.

Preferably, the precursor solution has an excess of 15 molar % lead organic salt with respect to target composition stoichiometry to compensate for volatilization of lead during heat treatment of the film.

The precursor solutions are prepared under dry nitrogen and ambient conditions in a glove box.

In relation to preparation of thin films of PZN-PT-based ferroelectric materials, PZN and PT solutions are prepared separately and mixed according to the target composition to form the precursor solution.

The PZN precursor solution is prepared by first dissolving a zinc organic salt, such as zinc acetate trihydrate, in 2-methoxyethanol (2-MOE) at 80° C. Subsequently, a niobium organic salt, such as niobium isopropoxide, is added to the solution with mechanical stirring or refluxing. The solution is allowed to clarify and is then cooled to room temperature. A separate solution of a lead organic salt, such as lead acetate trihydrate, in 2-MOE is prepared at 115° C. and the solution is stirred for 15 minutes. The two solutions are then mixed at room temperature and diluted with 2-MOE to obtain a concentration of 0.3 M.

When Ta instead of Nb is chosen for the $Pb(A^{2+}_{1/3}B^{5+}_{2/3})O_3$ system, a tantalum alkoxide, such as tantalum ethoxide is employed. Preparation of the solution follows that of the niobium organic salt.

The PT precursor solution is prepared by dissolving a lead organic salt, such as lead acetate trihydrate, in 2-MOE at 115° C. A separate solution of a titanium organic salt, such as titanium isopropoxide, in 2-MOE was prepared at 80° C. The two solutions were mixed at room temperature, and the mix solution was diluted with 2-MOE to obtain a concentration of 0.3 M.

Finally, the PZN and PT solutions were mixed at room temperature to obtain the precursor solution.

Alternatively, the precursor solutions may also be prepared through the method described below.

The PZN precursor solution is prepared by first dissolving a lead organic salt, such as lead acetate trihydrate, in 2-methoxyethanol (2-MOE) at 115° C. A zinc organic salt, such as zinc acetate, is added to the solution with mechanical stirring. The solution is allowed to clarify then cooled to room temperature.

A separate solution of a niobium organic salt, such as niobium-isopropoxide, in 2-MOE can be prepared at 60° C. The two solutions are then mixed at room temperature and diluted with 2-MOE to obtain a typical concentration of 0.3 M.

When Ta instead of Nb is chosen for the $Pb(A^{2+}_{1/3}B^{5+}_{2/3})O_3$ system, a tantalum alkoxide, such as tantalum ethoxide is employed. Preparation of the solution follows that of the niobium organic salt.

The PT precursor solution is prepared by dissolving a lead organic salt, such as lead acetate trihydrate, in 2-MOE at 115° C. A separate solution of a titanium organic salt, such as titanium isopropoxide, in 2-MOE is prepared at 80° C. The two solutions are mixed at room temperature, and the mix solution is diluted with 2-MOE to obtain a typical concentration of 0.3 M.

Finally, the PZN and PT solution precursors are mixed according to the target composition at room temperature. The concentration of the precursor solutions is typically 0.3 M.

In relation to preparation of thin films of PZN-PM-PT-based ferroelectric materials, solutions of PbO, $Zn_{1/3}Nb_{2/3}O_2$ (ZN), $Mg_{1/3}Nb_{2/3}O_2$ (MN) and $PbTiO_3$ (PT) are prepared separately and mixed according to the target composition to form the desired precursor solution.

To prepare the PbO solution, a lead organic salt, such as lead acetate trihydrate, is dissolved in 2-MOE at 110° C. and stirred for 15 minutes.

To prepare the ZN solution, a zinc organic salt, such as zinc acetate, is dissolved in 2-MOE at 80° C. for 10 minutes, followed by an addition of a niobium organic salt, for example Nb-isopropoxide, to the solution under reflux or with mechanical stirring. Upon clarification, the solution is cooled to room temperature.

To prepare the MN solution, magnesium nitride is dissolved in 2-MOE at 110° C. for 10 minutes, followed by the addition of an organic salt of niobium, for example niobium isopropoxide, under reflux or mechanical stirring. Upon clarification, the solution is cooled to room temperature.

It will be understood that when Ta is selected rather than Nb for the $Pb(A^{2+}_{1/3}B^{5+}_{2/3})O_3$ system, a tantalum alkoxide, such as tantalum ethoxide is substituted for the organic salt of niobium, and the required solution is prepared as described above.

To prepare the PT solution, two separate solutions of lead and titanium are prepared in 2-MOE at 115° C. and 80° C., respectively. The two solutions are then mixed to prepare the PT solution at room temperature.

Finally, the PbO, ZN, MN, and PT solutions are then mixed at room temperature to obtain the precursor solution, generally with a concentration of 0.3 M.

The precursor solution is subsequently modified by addition of a polymer species thereto. Preferably, the polymer species is polyethylene glycol, in particular polyethylene glycol with a molecular weight of 200 (PEG200).

The precursor solution is modified by addition of PEG200 in an amount up to 60 wt % based on a metal oxide content in the precursor solution, but optimal results are obtained when the precursor solution is modified by addition of 60 wt % PEG200 based on the metal oxide content in the precursor solution.

The modified precursor solution is then applied to the surface of a selected substrate. The substrates include, but are not limited to, a perovskite single crystal substrate, such as LAO; a conductive oxide layer with a perovskite structure deposited on a perovskite single crystal; or a conductive oxide layer with a perovskite structure epitaxially deposited on epitaxial buffer layers successively grown on non-perovskite substrates.

Typically, the conductive metal oxide layer is selected from a group comprising $La_xSr_{1-x}MnO_3$, $La_xCa_{1-x}FeO_3$, $LaNiO_3$, $SrRuO_3$, $La_xSr_{1-x}CoO_3$, $La_xSr_{1-x}FeO_3$. Typically, the buffer layer is selected from a group comprising yttria-stabilized zirconia (YSZ), $YBa_2Cu_3O_{7-\delta}$ (YBCO), $La_{0.5}Sr_{0.5}MnO_3$ (LSMO).

The epitaxial deposition of the conductive metal oxide layer and the buffer layer can be achieved by using any existing methods of epitaxy and, notably, vapor phase epitaxy, metal organic chemical vapor deposition (MOCVD), molecular beam epitaxy (MBE), metal organic molecular beam epitaxy (MOMBE) or liquid phase epitaxy, or pulsed laser deposition.

In relation to the buffer layer, the thickness of the YSZ layer is 20-150 nm, the thickness of the YBCO layer is 100-250 nm, and the thickness of the LSMO layer is 200-350 nm.

The modified precursor is applied to the surface of the selected substrate by spin-coating at a speed of about 5000 rpm for 30 seconds in a clean room. The resulting wet coating is generally dried at 100° C. for 2 minutes, followed by a pyrolysis treatment at 430° C. for 5 minutes and a pre-annealing at 580° C. for 10 minutes.

The above described process may be successively repeated until a thickness of about 250 nm is obtained. The film is then finally annealed at a temperature between 580-700° C. for 10 minutes.

The thin film of ferroelectric material may optionally be provided with a top electrode of Au layer of 200 nm in thickness, which is deposited with a sputtering method.

Accordingly, a thin film of ferroelectric material with a high mole fraction of $Pb(A^{2+}_{1/3}B^{5+}_{2/3})O_3$ substantially in a perovskite phase, wherein A is zinc or a combination of zinc and magnesium, and B is valence 5 element, such as niobium or tantalum, deposited on a surface of a substrate can be prepared in accordance with the previously described method of the present invention.

The invention will now be further described with reference to the following examples.

EXAMPLE 1

PZN-PT Thin Films on LAO Substrate

In this example, the preparation of epitaxial ferroelectric $(1-x)Pb(Zn_{1/3}Nb_{2/3})O_3$-$xPbTiO_3$ (PZN-xPT) thin films on a perovskite $LaAlO_3$ (LAO) single crystal substrate is described.

The PZN precursor solution was prepared by first dissolving zinc acetate trihydrate (0.00500 mol) in 2-methoxyethanol (2-MOE) at 80° C. Subsequently, niobium isopropoxide (0.01000 mol) was added to the solution with mechanical stirring or reluxing. The solution was allowed to clarify then cooled to room temperature. A separate solution of lead acetate trihydrate (0.01725 mol) in 2-MOE was prepared at 115° C. and the solution was stirred for 15 minutes. The two solutions were then mixed at room temperature and diluted with 2-MOE to obtain a concentration of 0.3 M.

The PT precursor solution was prepared by dissolving lead acetate trihydrate (0.03450 mol) in 2-MOE at 115° C. A separate solution of titanium isopropoxide (0.0300 mol) in 2-MOE was prepared at 80° C. The two solutions were mixed at room temperature, and the mix solution was diluted with 2-MOE to obtain a concentration of 0.3 M.

Finally, the PZN and PT solutions were mixed at room temperature to obtain PZN-xPT compositions with x from 0.1 to 0.5.

Alternatively, the PZN-xPT precursor solutions may also be prepared through the method described below.

The PZN precursor solution was prepared by first dissolving lead acetate trihydrate (0.01725 mol in 2-methoxyethanol (2-MOE) at 115° C. Zinc acetate (0.00500 mol) was added to the solution with mechanical stirring. The solution was allowed to clarify then cooled to room temperature. A separate solution of niobium-isopropoxide (0.01000 mol) in 2-MOE was prepared at 60° C. The two solutions were then mixed at room temperature and diluted with 2-MOE to obtain a concentration of 0.3 M.

The PT precursor solution was prepared by dissolving lead acetate trihydrate (0.03450 mol) in 2-MOE at 115° C. A separate solution of titanium isopropoxide (0.0300 mol) in 2-MOE was prepared at 80° C. The two solutions were mixed at room temperature, and the mix solution was diluted with 2-MOE to obtain a concentration of 0.3 M.

Finally, the PZN and PT solution precursors were mixed according to the target compositions at room temperature. The concentration of the final PZN-xPT solutions was 0.3 M.

Three PZN-xPT precursor solutions for target compositions wherein x=0.1, 0.2, 0.3 were prepared under dry nitrogen and ambient conditions in a glove box as described above. PZN and PT precursor solutions were prepared separately and mixed according to the target compositions. Notably, however, the PZN and PT precursor solutions were provided with a 15% molar excess of Pb with respect to the stoichiometric ratios of the target compositions to compensate for Pb evaporation during subsequent thermal treatment.

It was observed that the PZN solution was more stable when Pb and mixed Zn—Nb precursor solutions were prepared separately and mixed together, compared with the method in which mixed Pb—Zn and Nb solutions were prepared separately and mixed together subsequently. The PZN solution prepared with the former method was still transparent and demonstrated no precipitation even after at least 6 months had elapsed since initial preparation thereof.

The PZN-xPT solutions were subsequently modified with polyethylene glycol with a molecular weight of 200 (PEG200). Based on the weight of the metal oxide in the solution, 30-80 wt % of the PEG200 was added to the PZN-xPT solutions, and the solution was stirred for 30 minutes. The solution was then spin-coated on a (100)-$LaAlO_3$ (LAO) single crystal substrate at a speed of 5000 rpm for 30 seconds in a clean room. The wet films were dried at 100° C. for 2 minutes, followed by a pyrolysis at 430° C. for 5 minutes and a pre-annealing at 580° C. for 10 minutes. A thickness of 0.25 μm was obtained by repeating the process. The film was finally annealed at a temperature between 580-700° C. for 10 minutes.

Figure 2:
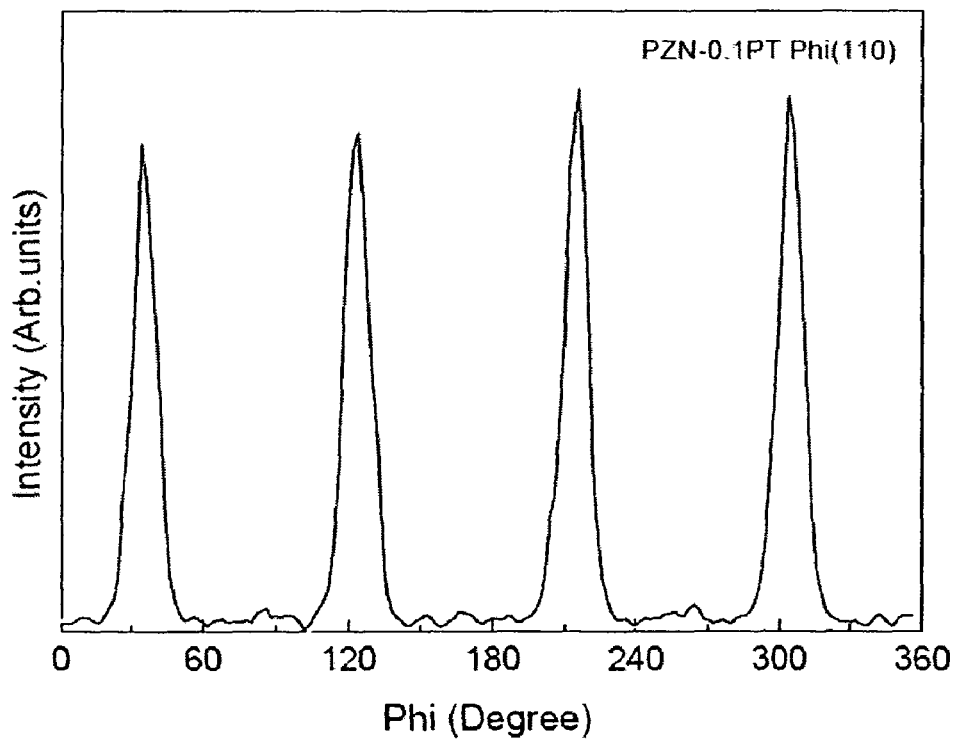
FIG. 2 shows phi-scan (XRD) patterns of (110)-plane of the perovskite phase in a PZN-0.1PT thin film on LAO substrate prepared from the precursor solution modified with 60 wt % of PEG200 according to Example 1, and annealed at 580° C. for 10 minutes.
Figure 3:
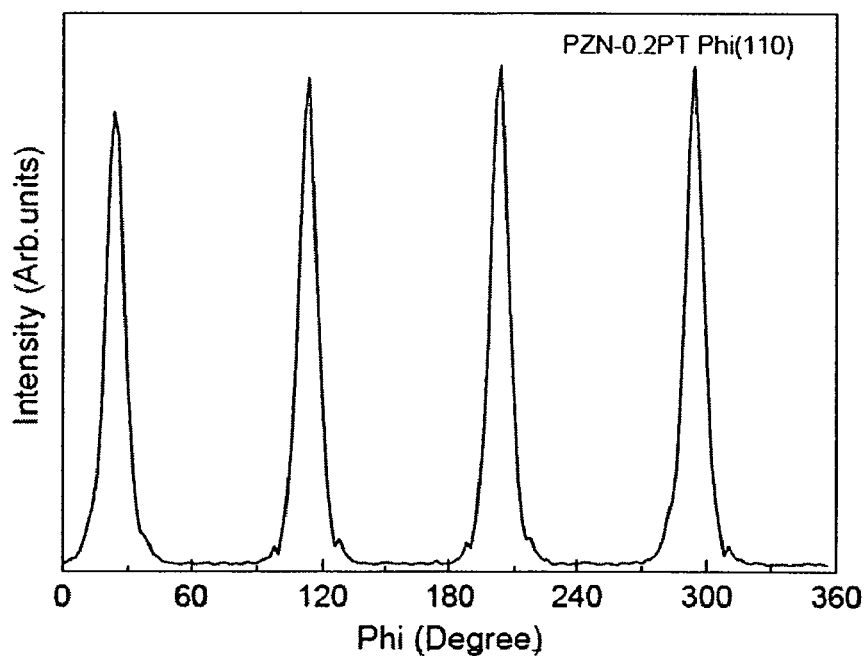
FIG. 3 shows phi-scan (XRD) patterns of (110)-plane of the perovskite phase in a PZN-0.2PT thin film on LAO substrate prepared from the precursor solution modified with 60 wt % of PEG200 according to Example 1, and annealed at 580° C. for 10 minutes.
Figure 4:
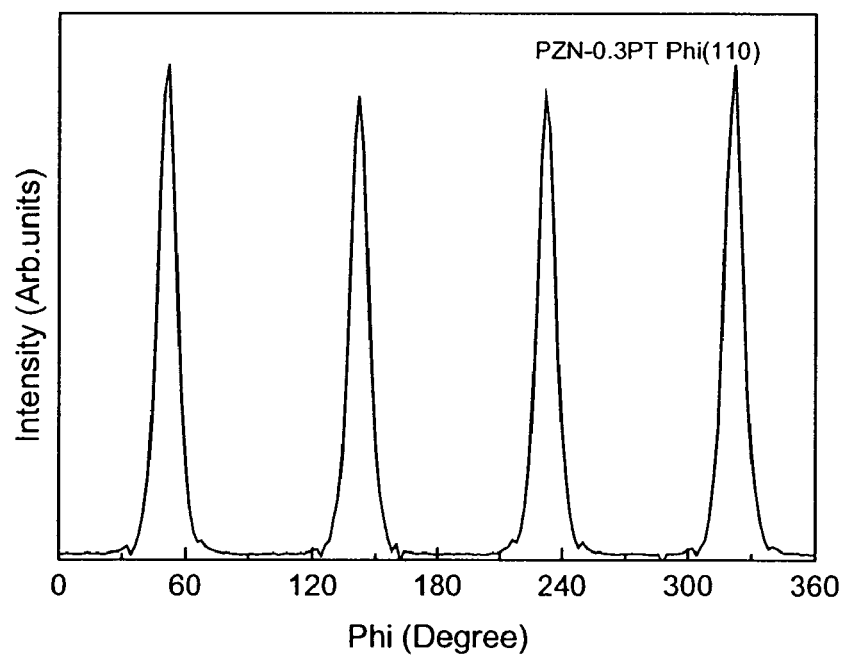
FIG. 4 shows phi-scan (XRD) patterns of (110)-plane of the perovskite phase in a PZN-0.3PT thin film on LAO substrate prepared from the precursor solution modified with 60 wt % of PEG200 according to Example 1, and annealed at 580° C. for 10 minutes.

X-ray diffraction (XRD) results indicated that a single perovskite phase was obtained when the PT concentration is above 30% in mole. FIG. 1 shows the x-ray diffraction (XRD) patterns of the PZN-0.1PT, PZN-0.2PT and PZN-0.3PT thin films annealed at 580° C. for 10 minutes, which were derived from their corresponding precursor solutions modified with 60 wt % of PEG200. Dominant ferroelectric perovskite phases with (001) orientation were obtained for all the samples. Only minor pyrochlore phase was observed, whose evidence increased with decreasing the PT concentration. FIGS. 2, 3, and 4 present the phi-scan results of plane (110) of the perovskite phase in the PZN-0.1PT, PZN-0.2PT and PZN-0.3PT thin films, respectively. The results show that the obtained perovskite phase in the PZN-xPT thin films has a single in-plane orientation through epitaxial growth on the LAO substrate.

Figure 5A:
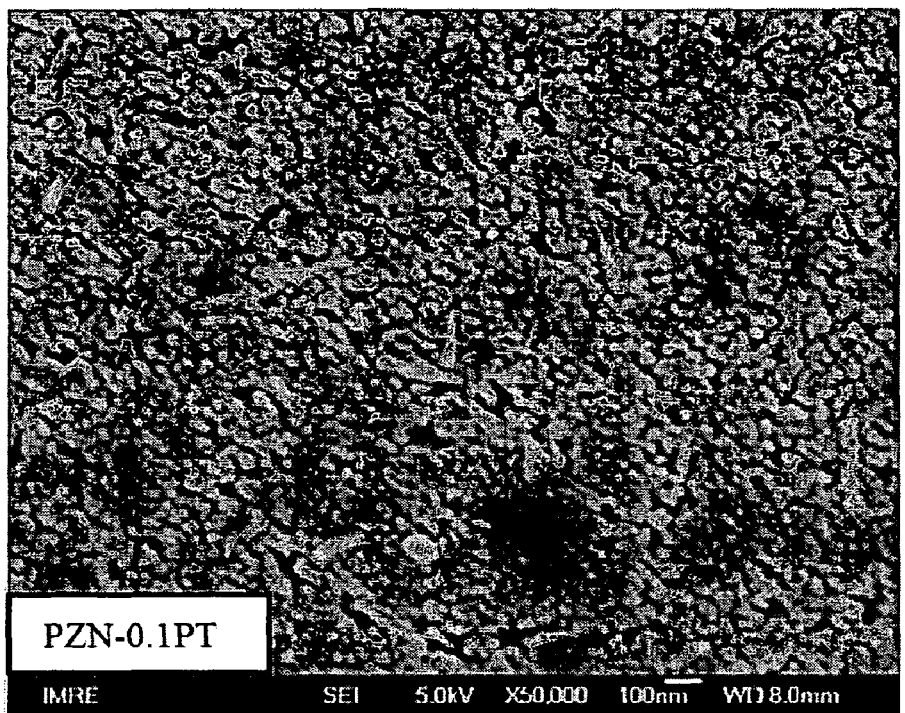
FIG. 5 shows scanning electron microscopic (SEM) images of a PZN-0.1PT thin film on LAO substrate prepared from the precursor solution modified with 60 wt % of PEG200 according to Example 1, and annealed at 700° C. for 10 minutes: (a) surface and (b) cross-section.
Figure 5B:
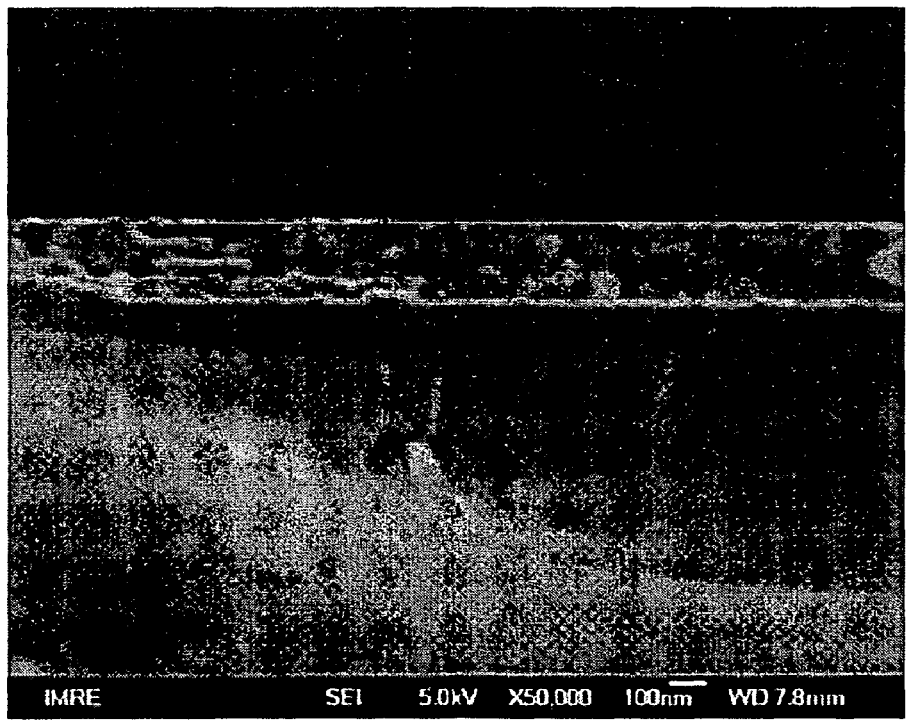
Figure 6:
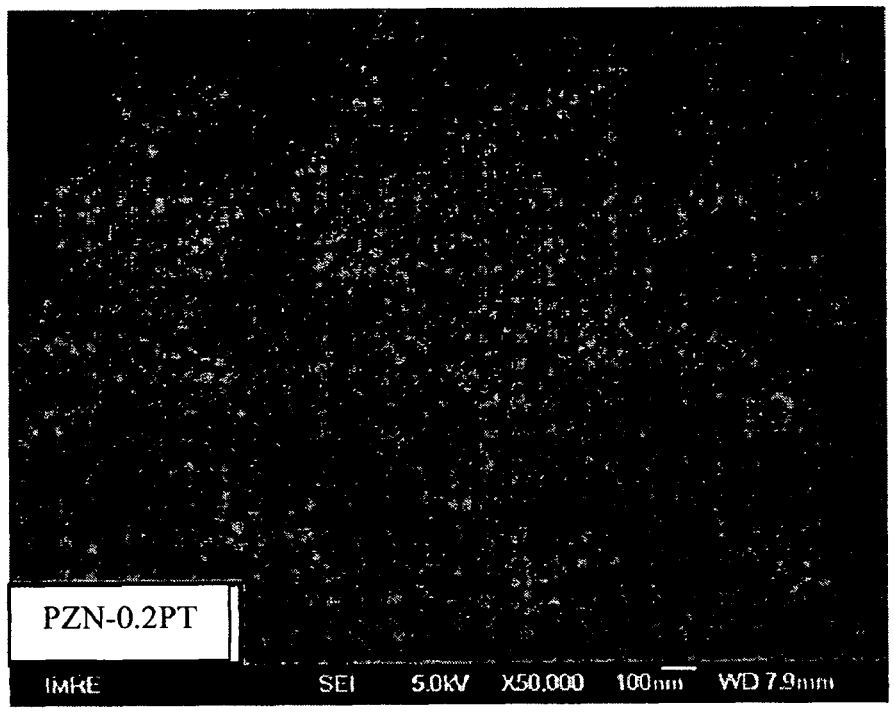
FIG. 6 shows an SEM images of the surface of a PZN-0.2PT thin film on LAO substrate prepared from the precursor solution modified with 60 wt % of PEG200 according to Example 1, and annealed at 700° C. for 10 minutes.
Figure 7:
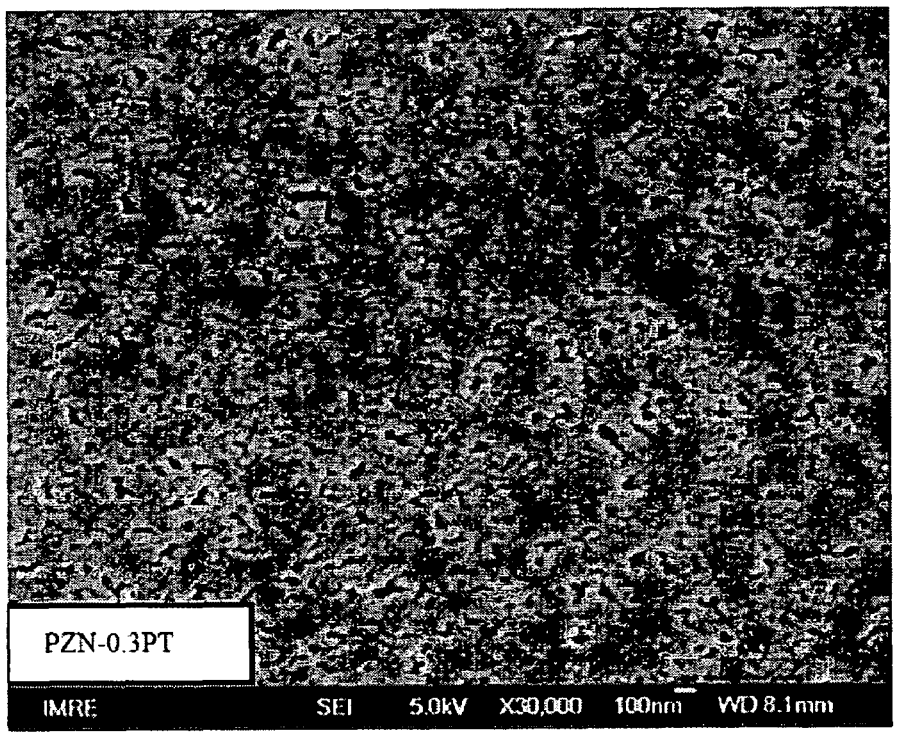
FIG. 7 shows an SEM images of the surface of a PZN-0.3PT thin film on LAO substrate prepared from the precursor solution modified with 60 wt % of PEG200 according to Example 1, and annealed at 700° C. for 10 minutes.

FIGS. 5(a) and 5(b) show the scanning electron microscopic (SEM) images for the surface and cross-section of a PZN-0.1PT thin film annealed at 700° C. FIGS. 6 and 7 show the surfaces of PZN-0.2PT and PZN-0.3PT thin films, respectively. The thickness of the thin film was around 0.25 μm. Pores were also observed on the surface of all the films.

Figure 8:
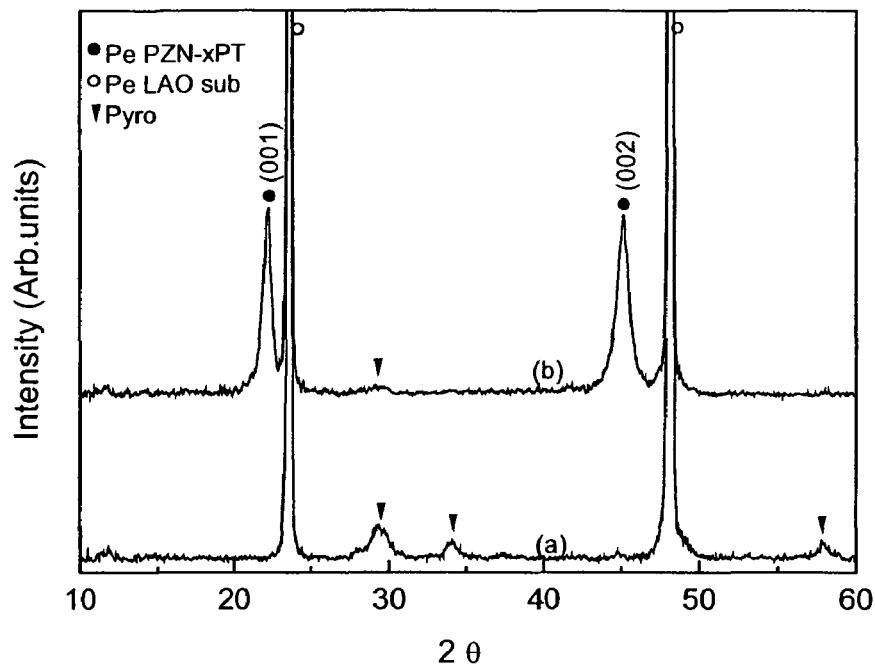
FIG. 8 shows XRD patterns of PZN-0.2PT thin films on LAO substrate prepared from a precursor solution without PEG200 (a) and a precursor solution modified with 60 wt % of PEG200 (b): according to Example 1, and annealed at 580° C. for 10 minutes.

For comparison, PZN-xPT thin films were prepared on a LAO substrate with the same procedure as described above except no PEG addition in the precursor solution. FIGS. 8(a) and 8(b) show the XRD patterns for PZN-0.2PT thin films prepared from solution precursor without and with PEG200 modification, respectively. As shown in FIG. 8(a), the PZN-0.2PT film from the solution without the PEG additive exhibits a complete pyrochlore phase. Further investigation results showed that the pyrochlore phase still dominated even when PT concentration was higher than 50% in mole. In contrast, dominant perovskite phase was obtained in the PZN-0.2PT thin film derived from the PEG200 modified solution. The pyrochlore phase could be eliminated when the PT concentration was improved to 30% in mole.

Figure 9:
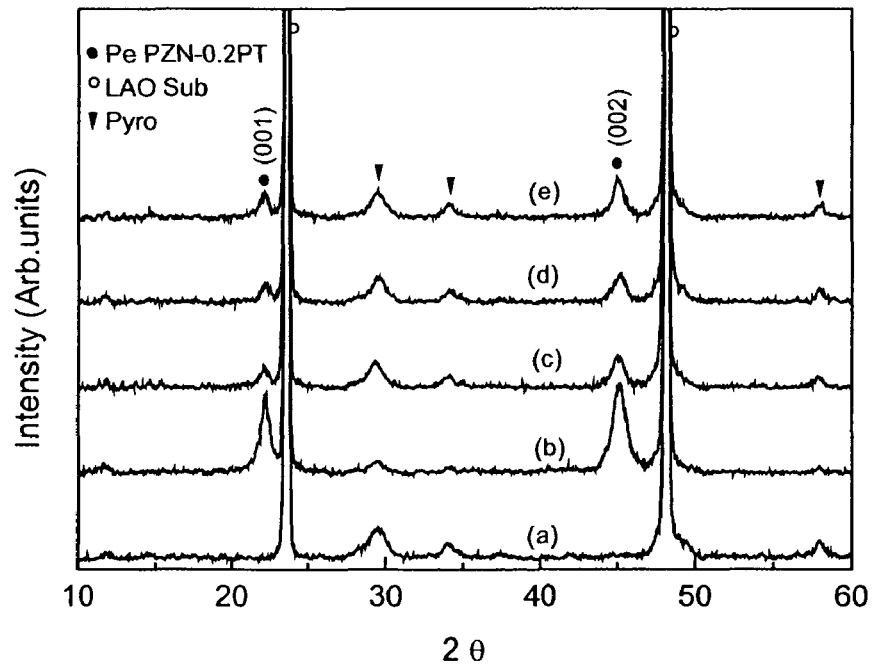
FIG. 9 shows XRD patterns of PZN-0.2PT thin films on LAO substrate prepared from a precursor solution modified with 30 wt % of PEG of different molecular weights: (a) ethylene glycol, (b) PEG200, (c) PEG400, (d) PEG600, and (e) PEG1450 according to Example 1, and annealed at 580° C. for 10 minutes.

For comparison, PZN-0.2PT thin films were prepared on LAO substrate from the PZN-PT precursor solutions modified with the PEG of different molecular weights. Ethylene glycol and PEG with the molecular weights of 200, 400, 600 and 1450 were added to the PZN-0.2PT solution, separately. The amount of the organic polymers was 30% by weight, based on the total metal oxides in the solutions. As described above, each coating layer was dried at 100° C. for 2 minutes, followed by pyrolysis at 430° C. for 5 minutes and a pre-annealing at 580° C. for 10 minutes. FIG. 9 shows the XRD patterns of the 4-layer PZN-0.2PT thin films prepared from the solutions modified with the PEG of different molecular weight after annealing at 580° C. for 10 minutes. Referring to FIG. 9, the film prepared from the PEG200-modified solution exhibits the dominant amount of perovskite phase. In contrast, the film modified with ethylene glycol showed only pyrochlore phase, and the films modified with PEG of larger molecular weights exhibited dominant pyrochlore phase.

For further comparison, PZN-0.2PT thin films were prepared on LAO substrate from precursor solutions modified with varying concentrations of PEG200.

Figure 10:
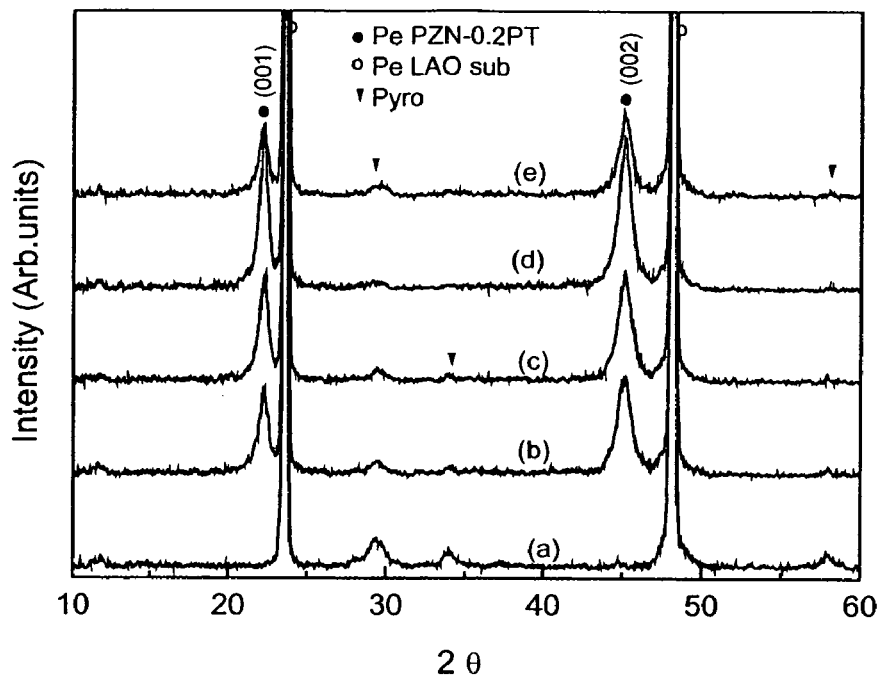
FIG. 10 shows XRD patterns of PZN-0.2PT thin films on LAO substrate prepared from a precursor solution modified with different amounts of PEG200: (a) no PEG, (b) 30 wt %, (c) 45 wt %, (d) 60 wt %, and (e) 80 wt % according to Example 1, and annealed at 580° C. for 10 minutes.

A PZN-0.2PT solution was provided according to the same procedure as described above. Various amounts of PEG200 were introduced to the PZN-0.2PT solution, separately. Thin films were then prepared as described above. As shown by the XRD results of the resulting films in FIG. 10, the perovskite phase is significantly enhanced with increasing PEG amount in the range of 0-60 wt %, based on the total metal oxides in the solutions. The intensity of the diffraction peaks of the PZN-0.2PT perovskite phase is the strongest when the PEG200 additive is 60 wt %, and the percentage of pyrochlore phase is less than 5%. However, when PEG additive is 80 wt %, the intensity of pyrochlore phase peaks increases. Thus, the results indicated that 60 wt % of PEG200 is the optimal amount to stabilize the perovskite phase for the resulting PZN-0.2PT thin film.

Figure 11:
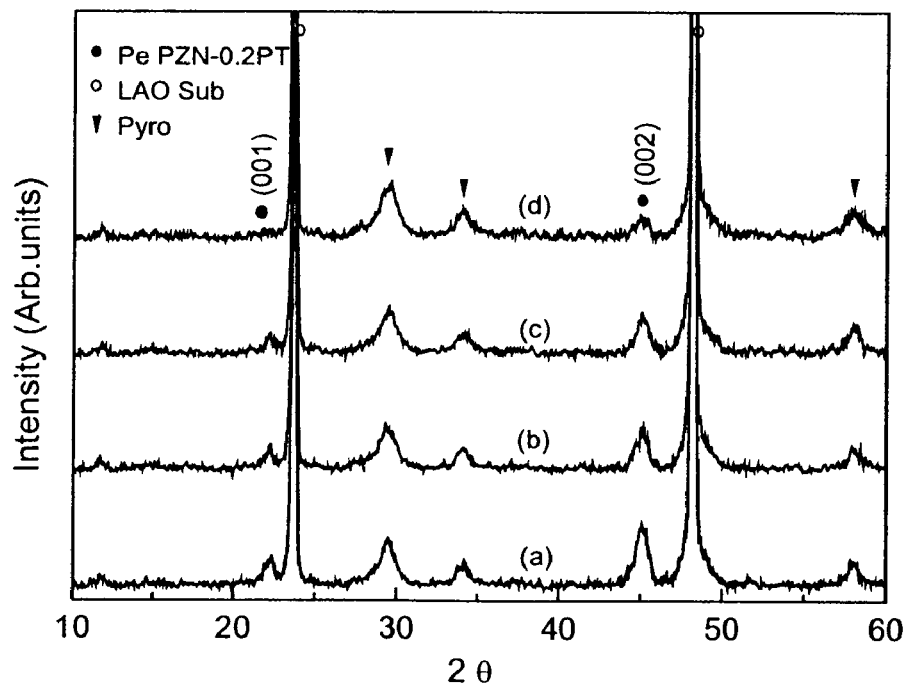
FIG. 11 shows XRD patterns of PZN-0.2PT thin films on LAO substrate prepared from precursor solutions modified with 30 wt % of polyvinylpyrrolidone (PVP) of different molecular weights: (a) PVP10000, (b) PVP55000, and (c) PVP1300000 according to Example 1.

The effect of modification of the precursor solutions with alternative water soluble polymers on the formation of ferroelectric thin films was also investigated. Several PZN-0.2PT thin films were prepared from PZN-PT precursor solutions modified with polyvinylpyrrolidone (PVP) of different molecular weights of 10000, 29000, 55000 and 1300000. The amount of the organic polymer species was 30% by weight, based on the metal oxides in the solution precursors. Preparation of precursor solutions and thin film deposition procedures were employed as described above. FIG. 11 shows the XRD patterns of the PZN-0.2PT thin films derived from the PVP-modified solutions. As shown in FIG. 11, pyrochlore phase dominates in all the thin films.

From the above results it is evident that modification of the PZN-PT precursor solution with a water soluble polymer, and the species, amount and molecular weight thereof has significant effects on the structure of the resulting PZN-xPT thin film.

EXAMPLE 2

PZN-xPT Thin Films on LaNiO3-Coated LAO

In this example, the preparation of epitaxial ferroelectric $(1-x)Pb(Zn_{1/3}Nb_{2/3})O_3$-$xPbTiO_3$ (PZN-xPT) thin films on a $LaNiO_3$ (LNO)-coated LAO substrate is described. LNO is a conductive oxide with a perovskite structure, functioning as the bottom electrode for the PZN-xPT thin film.

An epitaxial LNO layer can be prepared on LAO by many thin film processes. In this example, the LNO film was prepared through a solution method.

A 0.3M LNO solution was prepared by dissolving a 1:1 molar ratio of lanthanum nitrate and nickel acetate in acetic acid. The LNO solution was then deposited on the LAO substrate by successively repeating the spin-coating cycle to achieve a thickness of 0.2 μm. The annealing process was carried out at 700° C. for 60 minutes. The conductivity of the LNO layer was $3.5 \times 10^4$.

A solution precursor of PZN-0.3PT was prepared with the method described in Example 1. Based on the metal oxides in the solution, 60% by weight of PEG200 was added to the precursor solution. The solution was spin-coated on the LNO-coated LAO substrate with 5000 rpm for 30 seconds in a clean room. Each layer was dried at 100° C. for 2 minutes, followed by pyrolysis at 430° C. for 5 minutes and a pre-annealing at 580° C. for 10 minutes. A thickness of 0.25 μm was obtained by successively repeating the process. Finally, the film was annealed at 700° C. for 10 minutes. A top electrode of Au of 0.2 μm in thickness was deposited by sputtering for electrical property measurements.

Figure 12:
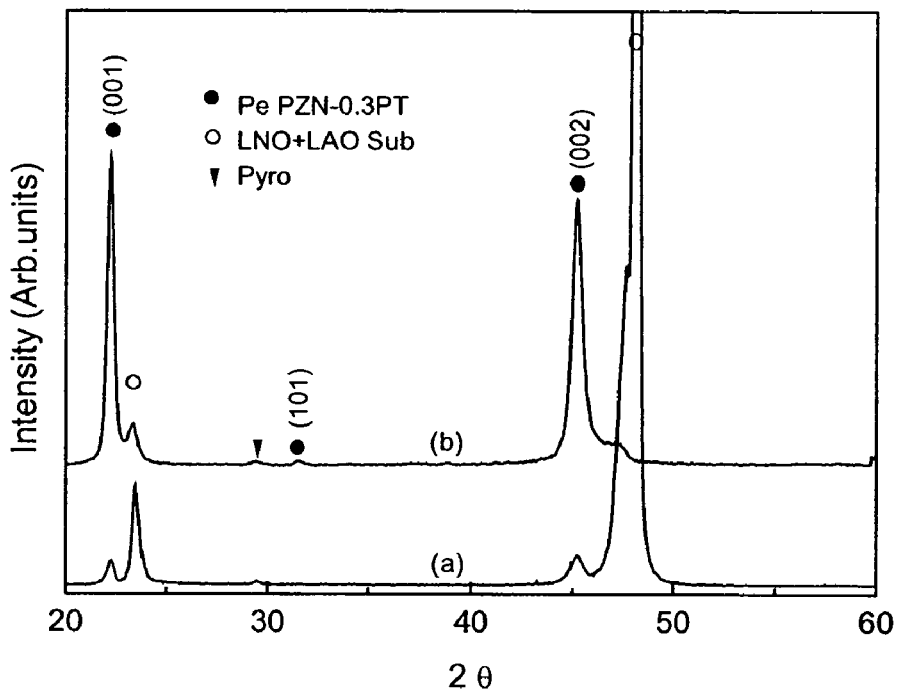
FIG. 12 shows XRD patterns of PZN-0.3PT thin films on LaNiO$_3$ (LNO) coated LAO substrate prepared from a precursor solution modified with 60 wt % PEG200 according to Example 2, and annealed at 580° C. for 10 minutes (a), and annealed at 700° C. for 10 minutes (b)

FIG. 12 shows the XRD results of the PZN-0.3PT thin films grown on the LNO-coated LAO substrate. The film exhibited perovskite phase with (001) orientation. Only a very little amount of pyrochlore phase was observed.

Figure 13:
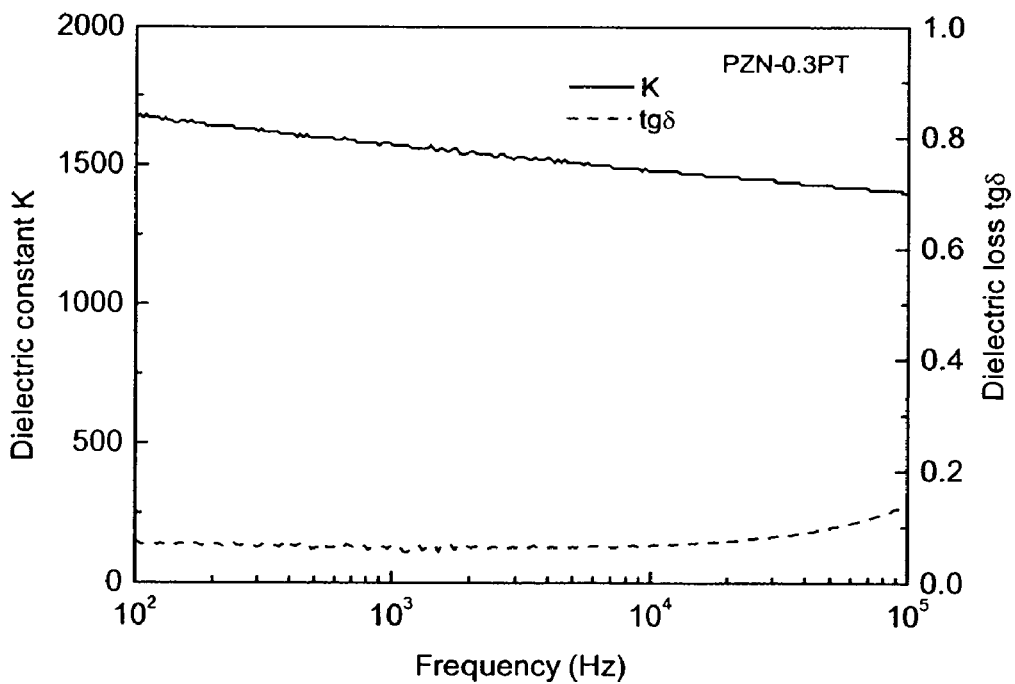
FIG. 13 shows dielectric constant and dielectric loss of a PZN-0.3PT thin film on LNO-coated LAO substrate prepared from the precursor solution modified with 60 wt % PEG200 according to Example 2, and annealed at 700° C. for 10 minutes.
Figure 14:
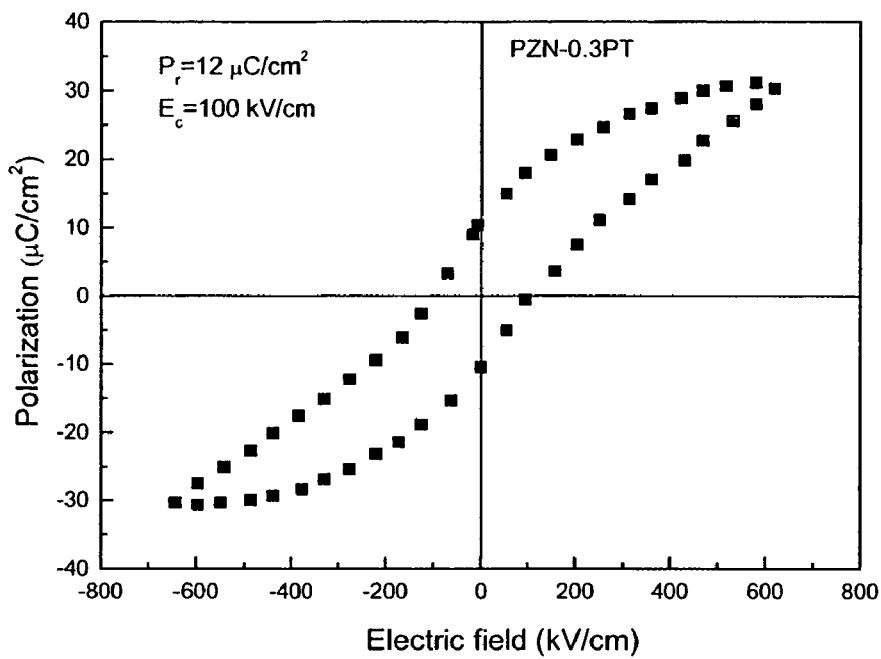
FIG. 14 shows a P-E hysteresis loop of PZN-0.3PT thin film on a LNO-coated LAO substrate prepared from the precursor solution modified with 60 wt % PEG200 according to Example 2, and annealed at 700° C. for 10 minutes.

FIG. 13 shows the frequency dependence of dielectric constant and dielectric loss of a PZN-0.3PT thin film grown on the LNO-coated LAO substrate. The dielectric constant and loss are 1570 and 0.06 at 1 kHz, respectively. The dielectric constant is fairly high and the loss is quite low, which are comparable with those of the PZT thin films. The P-E hysteresis loop of the PZN-0.3PT thin film is given in FIG. 14, exhibiting typical ferroelectric characteristics.

EXAMPLE 3

PZN-xPT Thin Films on Perovskite Conductive Oxide Layers on Silicon

Epitaxial PZN-xPT thin films can also be prepared on a conductive oxide layer which is expitaxially grown on some substrates whose structures or lattice parameters do not match perovskite PZN-xPT thin film through introduction of appropriate buffer layers. The perovskite conductive thin films include $La_xSr_{1-x}MnO_3$, $La_xCa_{1-x}FeO_3$, $LaNiO_3$, $SrRuO_3$, $La_xSr_{1-x}CoO_3$, $La_xSr_{1-x}FeO_3$, etc.

In Example 3, epitaxial yttria-stabilized zirconia (YSZ), $YBa_2Cu_3O_{7-\delta}$(YBCO), and $La_{0.7}Sr_{0.3}MnO_3$ (LSMO) layers are successively grown on (100)-oriented single crystal silicon substrate, followed by deposition of an epitaxial PZN-xPT thin film. The epitaxial deposition of the conductive LSMO and its buffer layers can be achieved by using any existing methods of epitaxy and, notably, vapor phase epitaxy, metal organic chemical vapor deposition (MOCVD), molecular beam epitaxy (MBE), metal organic molecular beam epitaxy (MOMBE) or liquid phase epitaxy. As examples, the epitaxy methods of MBE and pulsed laser deposition (PLD) are described.

(100)-oriented single crystal silicon substrate with mirror-polished surface is chosen to deposit the multiple oxide layers. Before the film deposition, the mirror surfaces are cleaned by etching with a 40% ammonium fluoride aqueous solution. The single crystal substrate is then secured to a substrate holder equipped with rotating and heating mechanisms installed in a vacuum chamber. The vacuum evaporation chamber is evacuated to a vacuum of $10^{-6}$ Torr by means of an oil diffusion pump and the substrate is heated to 850° C. and rotated. Thereafter, metallic zirconium and yttrium are supplied from their evaporation sources in a controlled Y/Zr molar ratio of 0.08:1. No oxygen is introduced at this point. When a feed amount corresponding to a Zr+Y alloy film's thickness of 1 nm is reached, oxygen gas is introduced from a nozzle at a rate of 10 cc/min to react with the metals to form a YSZ film of 20-150 nm thick.

Alternately, epitaxial YSZ thin film can also be deposited by a PLD process. The deposition temperature is 730° C., and the initial oxygen pressure is $10^{-7}$ mbar for a couple of minutes, followed by an increase to $5 \times 10^{-4}$ mbar.

Epitaxial YBCO and LSMO layers can be subsequently deposited by pulsed laser deposition (PLD) in another chamber on the epitaxial YSZ film. For the deposition of YBCO, the substrate temperature and oxygen pressure are 730° C. and 0.5 mbar, respectively. The typical thickness of the YBCO film is 100-250 nm. The substrate temperature and oxygen pressure are 670° C. and 0.2 mbar, respectively, for the deposition of LSMO of 200-350 nm in thickness.

A PEG200-modified PZN-xPT precursor solution is prepared according to the method described in Example 1. The solution is spin-coated on the conductive surface of LSMO/YBCO/YSZ/Si substrate with the procedure as described in Example 1. A top electrode of Au layer of 200 nm in thickness is deposited with sputtering method.

EXAMPLE 4

(1-x)Pb((Zn,Mg)⅓Nb⅔)O3-xPbTiO3(PZMN-xPT) Thin Films on LAO

The solution precursors for $(1-x)Pb((Zn,Mg)_{1/3}Nb_{2/3})O_3$-$xPbTiO_3$ (PZMN-xPT) thin films were prepared as described below.

Four solutions of PbO, $Zn_{1/3}Nb_{2/3}O_2$ (ZN), $Mg_{1/3}Nb_{2/3}O_2$ (MN) and $PbTiO_3$ (PT) solutions were prepared separately and mixed according to the target composition. To compensate for Pb evaporation during subsequent thermal treatment, a Pb excess of 15% in mole with respect to the stoichiometric amount was added.

To prepare the PbO solution, lead acetate trihydrate (0.02650 mol) was dissolved in 2-MOE at 110° C. and stirred for 15 minutes.

To prepare the ZN solution, zinc acetate (0.00462 mol) was dissolved in 2-MOE at 80° C. for 10 minutes, followed by an addition of Nb-isopropoxide (0.00924 mol) to the solution under reflux or with mechanical stirring. Upon clarification, the solution was cooled to room temperature.

To prepare the MN solution, magnesium nitride (0.00308 mol) was dissolved in 2-MOE at 110° C. for 10 minutes, followed by the addition of niobium isopropoxide (0.00616 mol) under reflux or mechanical stirring. Upon clarification, the solution was cooled to room temperature.

To prepare the PT solution, two separate solutions of lead acetate trihydrate (0.00793 mol) in 2-MOE at 115° C. and Ti-isopropoxide (0.00690 mo) in 2-MOE at 80° C. were prepared. The two solutions were then mixed to prepare the PT solution at room temperature.

Finally, the PbO, ZN, MN, and PT solutions were then mixed at room temperature to obtain the precursor solution with a composition of 0.77(0.6PZN-0.4PMN)-0.23PT and a PbO excess of 15% in mole. The solution was diluted with 2-MOE to obtain a concentration of 0.3 M.

Various amounts of PEG200 were added to the 0.77 (0.6PZN-0.4PMN)-0.23PT solution precursor, including 30%, 45%, 60% and 80% by weight, based on the metal oxides in the solution. After stirring, the solutions with PEG200 were respectively spin-coated on a LAO substrate at 5000 rpm for 30 seconds. Each layer was dried at 100° C. for 2 minutes, followed by pyrolysis at 430° C. for 5 minutes and pre-annealing at 580° C. for 10 minutes.

Figure 15:
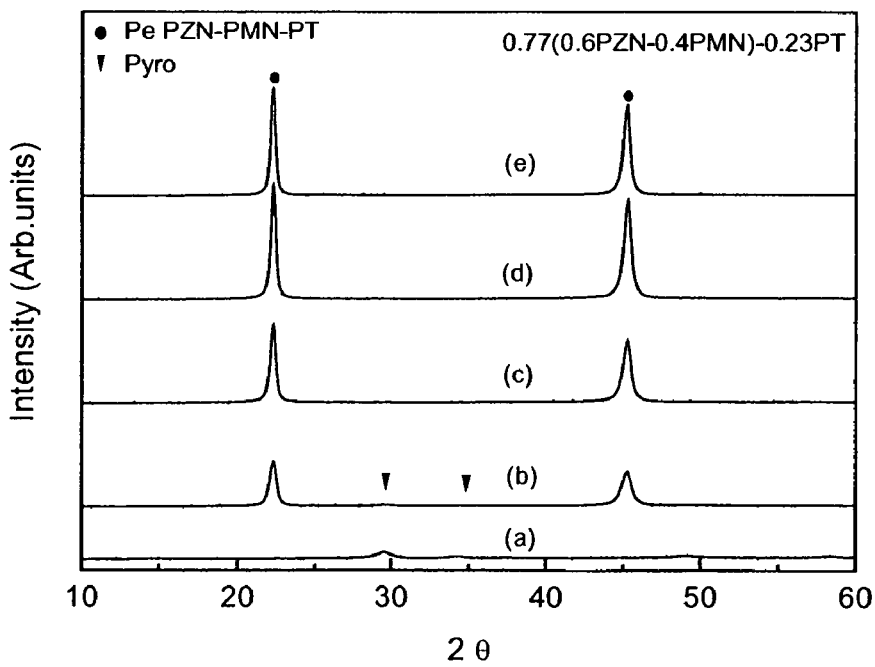
FIG. 15 shows XRD patterns of 0.77(0.6PZN-0.4PMN)-0.23PT thin films on LAO substrate prepared from precursor solutions modified with different amounts of PEG200: (a) no PEG, (b) 30 wt %, (c) 45 wt %, (d) 60 wt %, and (e) 80 wt % according to Example 4, and annealed at 580° C. for 10 minutes.

FIG. 15 presents the XRD patterns of the 0.77(0.6PZN-0.4PMN)-0.23PT thin films prepared from the solutions modified with different amount of PEG200. As shown in FIG. 15(b), with 30 wt % of PEG200 additives in the solution precursor, the resulting film mainly exhibits perovskite phase and very minor pyrochlore phase. When the PEG200 amount is increased to 45 wt %, 60 wt %, and 80 wt %, only single perovskite phase has been detected, as shown in FIG. 15(c), 15(d) and 15(e), respectively.

For comparison purposes, the solution without addition of any PEG200 was also deposited on a LAO substrate using the same procedure as described above. The XRD result of the film is given in FIG. 15(a). In contrast, only pyrochlore phase but no perovskite phase is formed in the film, as evident in FIG. 15(a). The results demonstrate that addition of PEG200 to the solution precursor plays a crucial role to promote the formation of perovskite phase in the resulting PZMN-xPT thin film.

EXAMPLE 5

(1-x)Pb((Zn,Mg)⅓Nb⅔)O3-xPbTiO3(PZMN-xPT) Thin Films on LSMO/LAO

An epitaxial $La_{0.7}Sr_{0.3}MnO_3$ (LSMO) thin film was coated on a LAO substrate as bottom electrode by pulsed laser deposition (PLD) method. The processing conditions were the same as described in Example 3, resulting in a conductivity of about $3 \times 10^{-4}$ $\Omega$·cm.

A PZMN-xPT thin film was then coated using the same PZMN-PT solution with 60 wt % PEG200 additive, which was prepared according to the method in Example 4, on the top of the LSMO film. The spin coating was conducted at 5000 rpm for 30 seconds in a clean room. Each coating layer was dried at 100° C. for 2 minutes, followed by pyrolysis at 430° C. for 5 minutes and pre-annealing at 580° C. for 10 minutes. A thickness of 1 μm was obtained by repeating the process. Finally, the film was annealed at 700° C. for 10 minutes.

Figure 16:
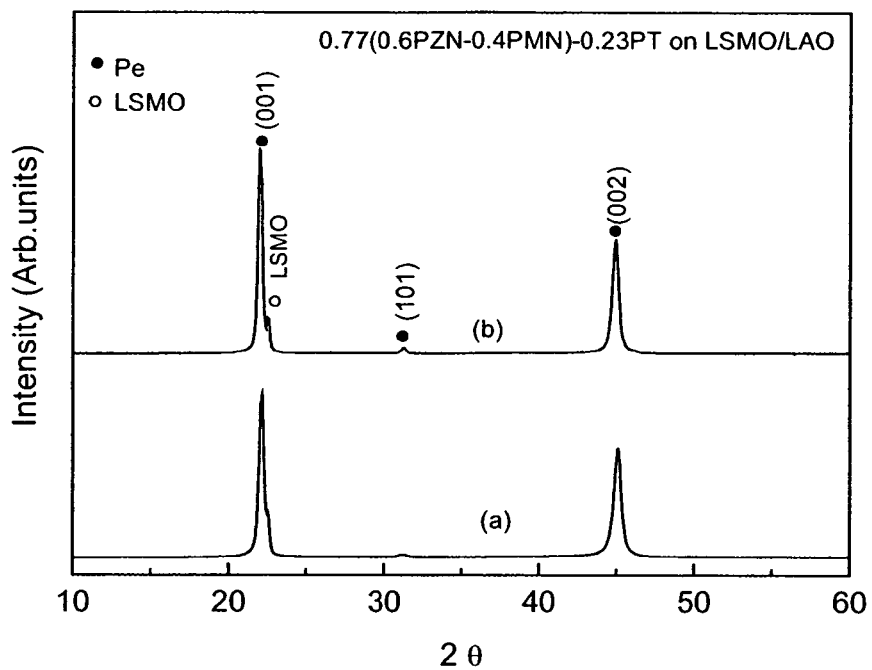
FIG. 16 shows XRD patterns of 0.77(0.6PZN-0.4PMN)-0.23PT thin films on La$_{0.7}$Sr$_{0.3}$MnO$_3$ (LSMO) coated LAO substrate prepared from a precursor solution modified with 60 wt % of PEG200 according to Example 5, and annealed at 580° C. for 10 minutes (a), and annealed at 700° C. for 10 minutes (b)

FIGS. 16 (a) and (b) show the XRD patterns of the 0.77 (0.6PZN-0.4PMN)-0.23PT thin films grown on the LSMO-coated LAO substrates, annealed at 580° C. and 700° C., respectively. The films show a single perovskite phase with a high (001) orientation.

Top electrode layer of Au with a thickness of 200 nm was deposited by sputtering.

Figure 17:
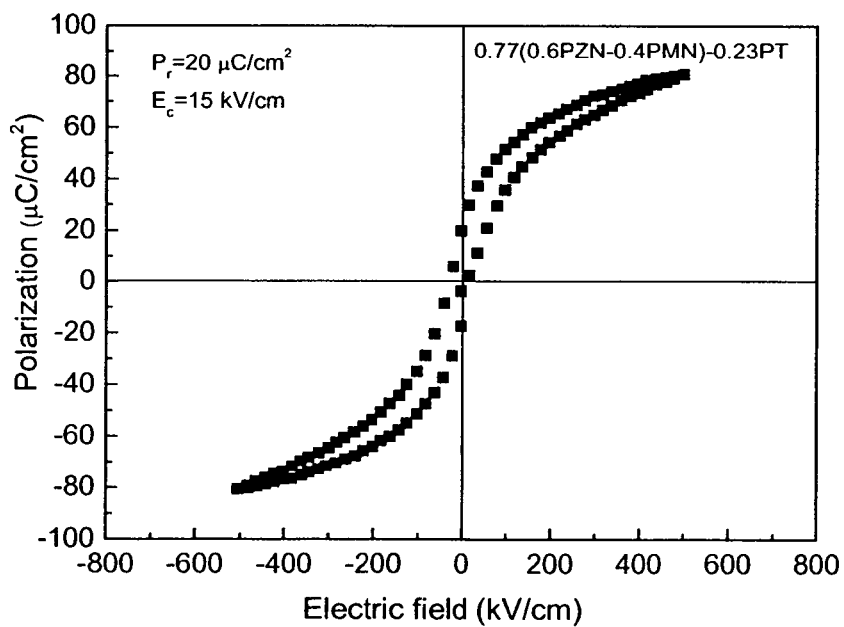
FIG. 17 shows a P-E hysteresis loop of 0.77(0.6PZN-0.4PMN)-0.23PT thin films on La$_{0.7}$Sr$_{0.3}$MnO$_3$ (LSMO) coated LAO substrate prepared from the precursor solution modified with 60 wt % PEG200 according to Example 5, and annealed at 700° C. for 10 minutes.

FIG. 17 presents the polarization-electric field (P-E) hysteresis loop of a 0.77(0.6PZN-0.4PMN)-0.23PT thin film, indicating the strong ferroelectric characteristics. The remnant polarization and coercive field are 20 μC/cm² and 15 kV/cm, respectively.

Figure 18:
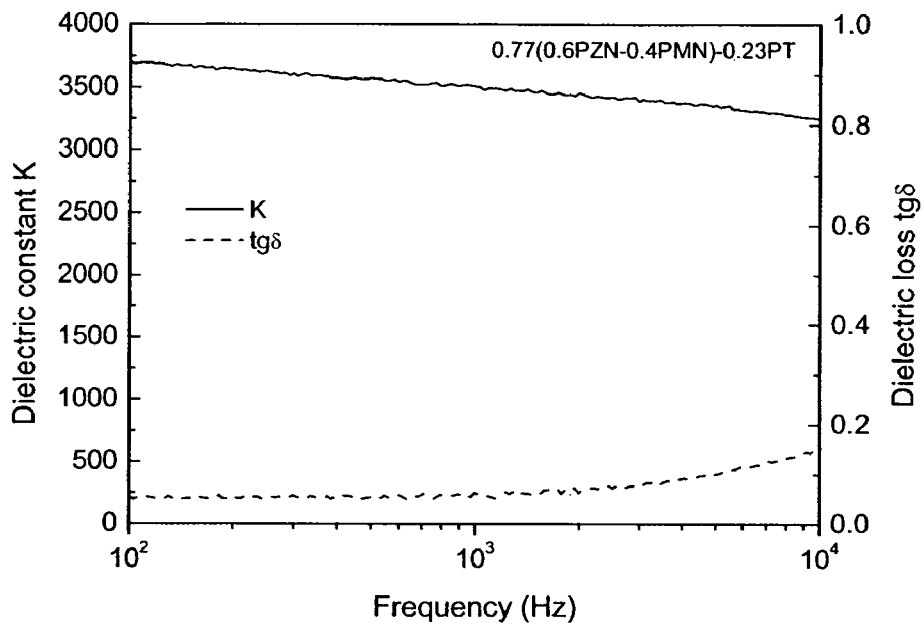
FIG. 18 shows dielectric constant and dielectric loss of a 0.77(0.6PZN-0.4PMN)-0.23PT thin films on La$_{0.7}$Sr$_{0.3}$MnO$_3$ (LSMO) coated LAO substrate prepared from the precursor solution modified with 60 wt % PEG200 according to Example 5, and annealed at 700° C. for 10 minutes.

FIG. 18 shows the frequency dependences of dielectric constant (K) and dielectric loss (tgδ) of the thin film. The dielectric constant and loss are 3494 and 0.06 at 1 kHz, respectively. The high dielectric constant shows the great potential of PZMN-xPT thin film as capacitor medium material.

Figure 19:
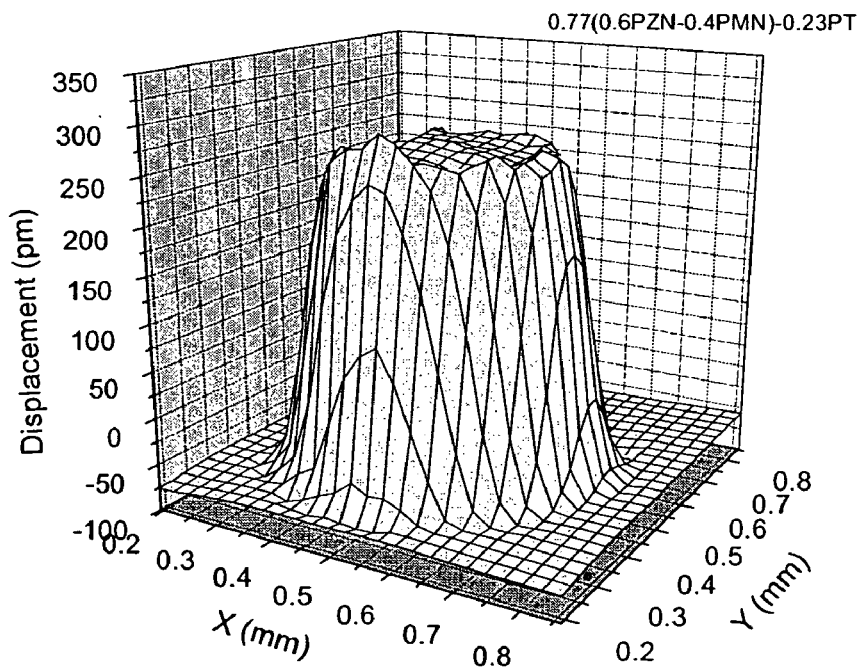
FIG. 19 shows a three-dimensional drawing of instantaneous vibration data of a 0.77(0.6PZN-0.4PMN)-0.23PT thin film sample driven by a sine wave electric signal (5V, 100 kHz), wherein the film was deposited on La$_{0.7}$Sr$_{0.3}$MnO$_3$ (LSMO) coated LAO substrate prepared from the precursor solution modified with 60 wt % PEG200 according to Example 5, and annealed at 700° C. for 10 minutes.

FIG. 19 presents a three-dimensional drawing of the instantaneous vibration data, under a sine-wave electrical driving voltage of 5V at 100 kHz. The dilatation of the thin film is about 325 pm. The effective $d_{33}$ is estimated to be about 65 pm/V without taking into account the clamping effect of the substrate. The actual piezoelectric constant should be significantly higher than this value.

Alternately, an epitaxial 0.77(0.6PZN-0.4PMN)-0.23PT thin film can also be deposited on LSMO/YBCO/YSZ/Si substrate. The fabrication of epitaxial LSMO, YBCO and YSZ layers on silicon substrate is as described in Example 3.

Figure 20:
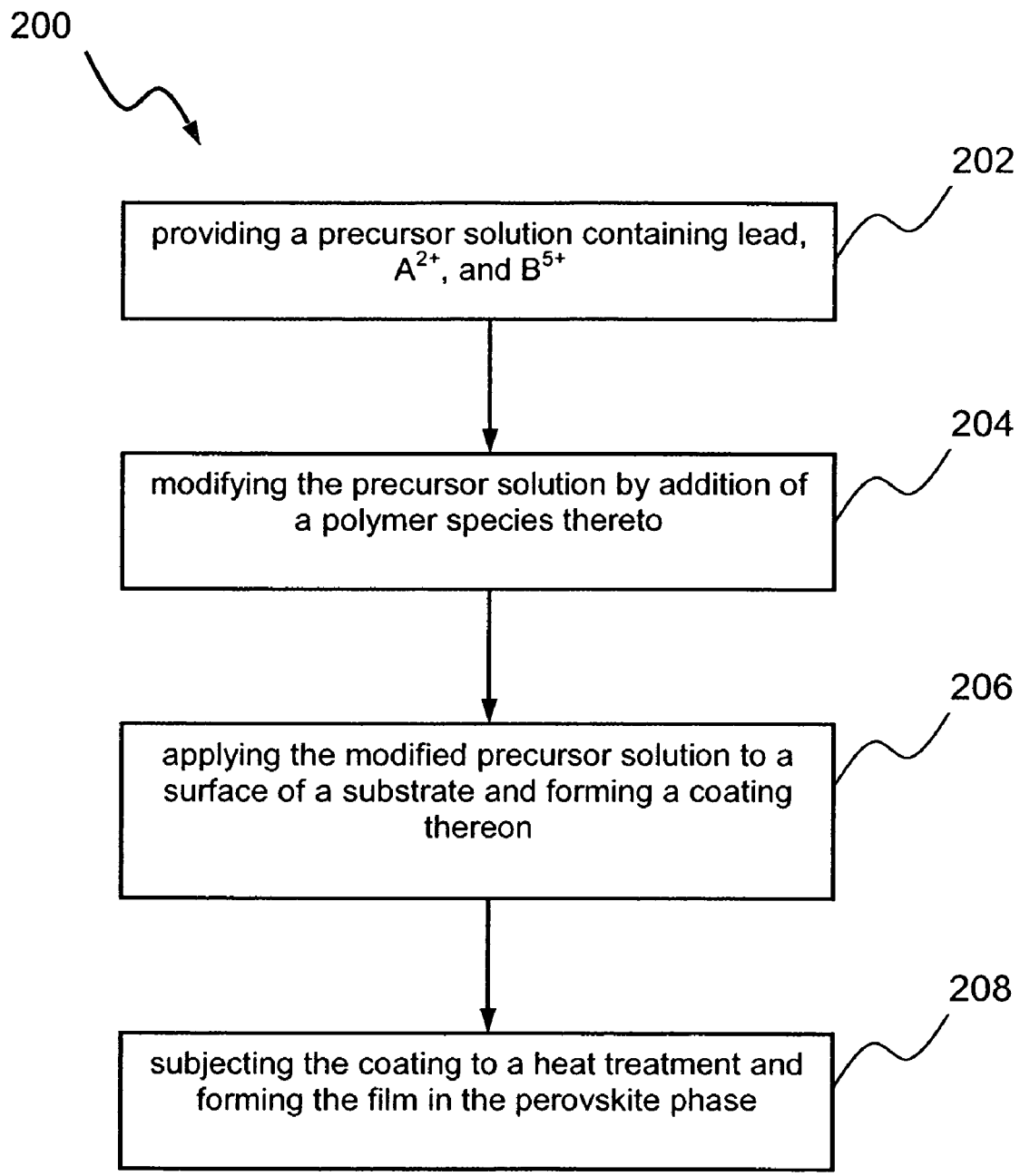
FIG. 20 is a flow chart showing a method according to the present invention.

FIG. 20 is a flow chart showing a method 200 for preparing a thin film of ferroelectric material according to the present invention. The thin film of ferroelectric material has a high mole fraction of $Pb(A^{2+}_{1/3}B^{5+}_{2/3})O_3$ substantially in a perovskite phase, wherein A is zinc or a combination of zinc and magnesium, and B is a valence 5 element, such as niobium or tantalum according to the present invention. In a first block 202, a precursor solution is prepared which contains lead, $A^{2+}$ and $B^{5+}$. In a next block 204, the precursor solution is modified by addition of a polymer species. In a subsequent block 206, the modified precursor solution is applied to a surface of a substrate and form a coating on the substrate. In a further block 208, the coating is subject to a heat treatment and forms the film in the perovskite phase.

Numerous variations and modifications will suggest themselves to persons skilled in the relevant art, in addition to those already described, without departing from the basic inventive concepts. All such variations and modifications are to be considered within the scope of the present invention, the nature of which is to be determined from the foregoing description.

The invention claimed is:

1. A ferroelectric thin film material having a thickness of less than 1 μm deposited on a surface of a substrate, forms a perovskite structure on said surface of said substrate and comprises a mole fraction of $Pb(A^{2+}_{1/3}B^{5+}_{2/3})O_3 > 0.7$ in a single perovskite phase, wherein A is zinc or a combination of zinc and magnesium, and B is a valence 5 element.

2. The ferroelectric thin film material as recited in claim 1, wherein B is niobium.

3. The ferroelectric thin film material as recited in claim 1, wherein B is tantalum.

4. The ferroelectric thin film material as recited in claim 1, wherein the ferroelectric material is $(1-x)Pb(Zn_{1/3}Nb_{2/3})O_3\text{-}xPbTiO_3 (0.05 \leq x \leq 0.3)$.

5. The ferroelectric thin film material as recited in claim 1, wherein the ferroelectric material is $(1-x)Pb((Zn_{1-2}Nb_{2/3})O_3\text{-}xPbTiO_3 (x \leq 0.3 \text{ and } 0 \leq y \leq 0.7)$.

6. The ferroelectric thin film material as recited in claim 1, wherein a composition of the thin film of ferroelectric material approaches a morphotropic phase boundary (MPB).

7. The ferroelectric thin film material as recited in claim 6, wherein the composition of the thin film of ferroelectric material is $0.9Pb(Zn_{1/3}Nb_{2/3})O_3\text{-}0.1PbTiO_3$.

8. The ferroelectric thin film material as recited in claim 6, wherein the composition of the thin film of ferroelectric material is $0.462Pb(Zn_{1/3}Nb_{2/3})O_3\text{-}0.308Pb(Mg_{1/3}Nb_{2/3})O_3\text{-}0.23PbTiO_3$.

9. The ferroelectric thin film material as recited in claim 1, wherein the substrate is a single crystal with a perovskite structure, and the thin film of ferroelectric material is epitaxially formed on the surface of the single crystal with the perovskite structure.

10. The ferroelectric thin film material as recited in claim 9, wherein the single crystal is $LaAlO_3$ (LAO).

11. The ferroelectric thin film material as recited in claim 1, wherein the surface of the substrate has a textured perovskite structure, and the thin film of ferroelectric material is epitaxially formed on the surface with the textured perovskite structure.

12. The ferroelectric thin film material as recited in claim 1, wherein the substrate is a conductive metal oxide layer with perovskite structure epitaxially deposited on a single crystal material with perovskite structure, and the thin film of ferroelectric material is epitaxially formed on the conductive layer.

13. The ferroelectric thin film material as recited in claim 12, wherein the conductive metal oxide layer is selected from a group comprising $La_xSr_{1-x}MnO_3$, $La_xCa_{1-x}FeO_3$, $LaNiO_3$, $SrRuO_3$, $La_xSr_{1-x}CoO_3$, $La_xSr_{1-x}FeO_3$.

14. The ferroelectric thin film material as recited in claim 1 wherein the substrate is an epitaxial metal oxide conductive layer with perovskite structure epitaxially deposited on at least one buffer layer on a single crystal material that is not perovskite structure, and the thin film of ferroelectric material is deposited on the metal oxide conductive layer.

15. The ferroelectric thin film material as recited in claim 14, wherein the conductive metal oxide layer is selected from a group comprising $La_xSr_{1-x}MnO_3$, $La_xCa_{1-x}FeO_3$, $LaNiO_3$, $SrRuO_3$, $La_xSr_{1-x}CoO_3$, $La_xSr_{1-x}FeO_3$.

16. The ferroelectric thin film material as recited in claim 1, wherein the ferroelectric thin film material has a thickness of less than 1 μm and greater than 0.25 μm.

17. The ferroelectric thin film material as recited in claim 1, wherein the ferroelectric thin film material has a thickness of less than 0.25 μm.

18. Microelectronic devices provided with a ferroelectric thin film material having a thickness of less than 1 μm that is deposited on a surface of a substrate, forms a perovskite structure on said surface of said substrate and comprises a high mole fraction of $Pb(A^{2+}_{1/3}B^{5+}_{2/3})O_3 > 0.7$ in a single perovskite phase wherein A is zinc or a combination of zinc and magnesium, and B is a valence 5 element.

19. The microelectronic devices as recited in claim 18, wherein B is niobium.

20. The microelectronic devices as recited in claim 18, wherein B is tantalum.

21. Micro electromechanical systems provided with a ferroelectric thin film material having a thickness of less than 1 μm that is deposited on a surface of a substrate, forms a perovskite structure on said surface of said substrate and comprises a high mole fraction of $Pb(A^{2+}_{1/3}B^{5+}_{2/3})O_3 > 0.7$ in a single perovskite phase wherein A is zinc or a combination of zinc and magnesium, and B is a valence 5 element.

22. The micro electromechanical systems as recited in claim 21, wherein B is niobium.

23. The micro electromechanical systems as recited in claim 21, wherein B is tantalum.

* * * * *

UNITED STATES PATENT AND TRADEMARK OFFICE
CERTIFICATE OF CORRECTION

PATENT NO. : 8,124,251 B2  
APPLICATION NO. : 11/333774  
DATED : February 28, 2012  
INVENTOR(S) : Yao et al.

Page 1 of 1

It is certified that error appears in the above-identified patent and that said Letters Patent is hereby corrected as shown below:

In the Specification

Column 7
Lines 57 & 59, delete "$YBa_2Cu_3O_{7-67}$" and insert -- $YBa_2Cu_3O_{7-\delta}$ --

Column 14
Line 61, delete "$5\times10_{-4}$" and insert -- $5\times10^{-4}$ --

Signed and Sealed this
Fifteenth Day of April, 2014

Michelle K. Lee
*Deputy Director of the United States Patent and Trademark Office*